United States Patent
Hatanaka

(10) Patent No.: US 10,690,953 B2
(45) Date of Patent: Jun. 23, 2020

(54) POLARIZING PLATE AND CIRCULARLY POLARIZING PLATE

(71) Applicant: Sumitomo Chemical Company, Limited, Tokyo (JP)

(72) Inventor: Nobuyuki Hatanaka, Osaka (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 0 days.

(21) Appl. No.: 15/558,756

(22) PCT Filed: Mar. 8, 2016

(86) PCT No.: PCT/JP2016/057221
§ 371 (c)(1),
(2) Date: Sep. 15, 2017

(87) PCT Pub. No.: WO2016/147960
PCT Pub. Date: Sep. 22, 2016

(65) Prior Publication Data
US 2018/0067348 A1 Mar. 8, 2018

(30) Foreign Application Priority Data
Mar. 16, 2015 (JP) .................. 2015-051786

(51) Int. Cl.
*G02F 1/1335* (2006.01)
*G02B 5/30* (2006.01)
(Continued)

(52) U.S. Cl.
CPC ............ *G02F 1/1335* (2013.01); *G02B 5/30* (2013.01); *G02B 5/305* (2013.01);
(Continued)

(58) Field of Classification Search
CPC ............ G02F 1/1335; G02F 1/13363; G02F 1/133528; G02B 5/30; G02B 5/305;
(Continued)

(56) References Cited

U.S. PATENT DOCUMENTS 5,280,373 A * 1/1994 Ozawa .................. G02F 1/1334 349/113
6,025,958 A * 2/2000 Yamaoka ............. G02B 5/3083 349/5

(Continued)

FOREIGN PATENT DOCUMENTS

CN 103123403 A 5/2013
CN 103173227 A 6/2013
(Continued)

OTHER PUBLICATIONS

Lub et al., "The Synthesis of Liquid-Crystalline Diacrylates Derived from Cyclohexane Units", Recl. Trav. Chim. Pays-Bas 115, pp. 321-328 (Jun. 6, 1996).

(Continued)

*Primary Examiner* — Hoan C Nguyen
(74) *Attorney, Agent, or Firm* — Panitch Schwarze Belisario & Nadel LLP

(57) ABSTRACT

A polarizing plate including a substrate and a polarizer is provided. The polarizer has a polarizing layer having a thickness of 5 μm or less in which a dichroic dye is oriented. The absorbance in the absorption axis direction (A1) of the polarizer at a wavelength of 380 to 760 nm is 0.3 or more and 1.5 or less, and the absorbance in the transmission axis direction (A2) is 0.001 or more and 0.15 or less.

6 Claims, 4 Drawing Sheets

(51) Int. Cl.
*H01L 51/50* (2006.01)
*G02F 1/13363* (2006.01)
*H01L 51/52* (2006.01)
*H01L 51/56* (2006.01)

(52) U.S. Cl.
CPC .......... *G02F 1/13363* (2013.01); *H01L 51/50* (2013.01); *H01L 51/5293* (2013.01); *H01L 51/56* (2013.01); *G02F 1/133528* (2013.01); *H01L 51/5281* (2013.01)

(58) Field of Classification Search
CPC ..... H01L 51/5293; H01L 51/56; H01L 51/50; H01L 51/5281
See application file for complete search history.

(56) References Cited

U.S. PATENT DOCUMENTS

| | | | | |
|---|---|---|---|---|
| 9,023,168 | B2* | 5/2015 | Kitagawa | B29C 55/023 156/247 |
| 2007/0024970 | A1 | 2/2007 | Lub et al. | |
| 2009/0103018 | A1* | 4/2009 | Matsumori | G02F 1/13363 349/96 |
| 2009/0115935 | A1* | 5/2009 | Maeda | G02F 1/133606 349/62 |
| 2009/0290214 | A1* | 11/2009 | Cho | C09B 5/48 359/487.02 |
| 2010/0157195 | A1* | 6/2010 | Miyatake | G02B 5/3033 349/62 |
| 2015/0062505 | A1* | 3/2015 | Hatanaka | G02B 5/3016 349/98 |
| 2015/0226895 | A1* | 8/2015 | Hatanaka | G02B 5/305 359/487.02 |

FOREIGN PATENT DOCUMENTS

| | | | | | |
|---|---|---|---|---|---|
| JP | S50-083482 | A | | 7/1975 | |
| JP | S58-038756 | A | | 3/1983 | |
| JP | 62123405 | A | * | 6/1987 | ............ G02B 5/205 |
| JP | S63-301850 | A | | 12/1988 | |
| JP | H2-113920 | A | | 4/1990 | |
| JP | H7-142170 | A | | 6/1995 | |
| JP | 2000137116 | A | * | 5/2000 | |
| JP | 2002185983 | A | | 6/2002 | |
| JP | 4719156 | B2 | | 7/2011 | |
| JP | 2013033248 | A | | 2/2013 | |
| JP | 2013101328 | A | | 5/2013 | |
| JP | 2013109090 | A | | 6/2013 | |
| JP | 2013148883 | A | * | 8/2013 | |
| JP | 2013210624 | A | * | 10/2013 | |
| JP | 5463666 | B2 | | 4/2014 | |

OTHER PUBLICATIONS

Int'l Search Report dated May 17, 2016 in Int's Application No. PCT/JP2016/057221.
Int'l Preliminary Report on Patentability dated Sep. 28, 2017 in Int'l Application No. PCT/JP2016/057221.
English Translation of Written Opinion dated May 17, 2016 in Int'l Application No. PCT/JP2016/057221.
Office Action dated Sep. 11, 2018 in JP Application No. P2015051786.
Office Action dated May 28, 2019 in CN Application No. 201680014684.8.
Office Action dated Jun. 13, 2019 in TW Application No. 105108145.
Office Action dated Dec. 13, 2019 in CN Application No. 201680014684.8.

* cited by examiner

POLARIZING PLATE AND CIRCULARLY POLARIZING PLATE

CROSS-REFERENCE TO RELATED APPLICATION

This application is a Section 371 of International Application No. PCT/JP2016/057221, filed Mar. 8, 2016, which was published in the Japanese language on Sep. 22, 2016, under International Publication No. WO 2016/147960 A1 and the disclosure of which is incorporated herein by reference.

TECHNICAL FIELD

The present invention relates to polarizing plates and circularly polarizing plates.

BACKGROUND ART

Circularly polarizing plates are used in organic electroluminescent (EL) image displaying devices to prevent reflection of external light in bright places. As such circularly polarizing plates, a polarizing plate in which poly(vinyl alcohol) (PVA) is dyed with iodine (iodine-PVA polarizing plate) is known, for example (see Patent Literature 1).

Particularly in the case where a circularly polarizing plate is used in the organic EL image displaying device, a polarizing plate having low absorbance is desired so as not to absorb light emitted from an organic EL element. In the case of the iodine-PVA polarizing plate, the absorbance can be reduced through a reduction in dyeing concentration of iodine.

CITATION LIST

Patent Literature

Patent Literature 1: JP 07-142170 A

SUMMARY OF INVENTION

Technical Problem

However, such an iodine-PVA polarizing plate having low iodine concentration has problems such that iodine sublimates and denatures, causing change of color, in some environments for use, and warpage generates as a result of relaxing the stretch of PVA. Moreover, it is difficult to form the iodine-PVA polarizing plate into a thin film, and the iodine-PVA polarizing plate has a limitation in applications to display devices required for more reduced profiles.

Accordingly, an object of the present invention is to provide a polarizing plate and a circularly polarizing plate having high light absorbing selectivity even in the form of a thin film, and having high heat resistance.

Solution to Problem

The present invention includes the following aspects.

[1] A polarizing plate comprising a substrate and a polarizer, wherein the polarizer has a polarizing layer having a thickness of 5 μm or less in which a dichroic dye is oriented, and an absorbance in the absorption axis direction (A1) of the polarizer at a wavelength of 380 to 760 nm is 0.3 or more and 1.5 or less, and an absorbance in a transmission axis direction (A2) is 0.001 or more and 0.15 or less.

[2] The polarizing plate according to [1], wherein the dichroic dye is an organic dye.

[3] The polarizing plate according to [1] or [2], wherein the polarizing layer comprises a polymer of a polymerizable liquid crystal compound.

[4] The polarizing plate according to [3], wherein the polymerizable liquid crystal compound is a compound exhibiting a smectic liquid crystal phase.

[5] The polarizing plate according to [4], wherein the polymerizable liquid crystal compound is a compound exhibiting a higher smectic liquid crystal phase.

[6] The polarizing plate according to any one of [1] to [4], wherein the polarizer exhibits a Bragg peak in X-ray diffraction measurement.

[7] A circularly polarizing plate comprising the polarizing plate according to any one of [1] to [6], and a ¼ wavelength plate.

[8] The circularly polarizing plate according to [7], wherein a birefringence of the ¼ wavelength plate to light having a wavelength of 450 nm, a birefringence to light having a wavelength of 550 nm, and a birefringence to light having a wavelength of 650 nm have reverse wavelength dispersibility satisfying relationships represented by the following expressions (II) and (III):

$$\Delta n(450)/\Delta n(550) \leq 1.00 \qquad (II)$$

$$1.00 \leq \Delta n(650)/\Delta n(550) \qquad (III)$$

wherein $\Delta n(\lambda)$ represents a birefringence to light having a wavelength nm.

Advantageous Effect of Invention

According to the present invention, a polarizing plate and circularly polarizing plate can be provided which have high light absorbing selectivity even in the form of a thin film, and have high heat resistance.

DESCRIPTION OF EMBODIMENTS

Figure 1:
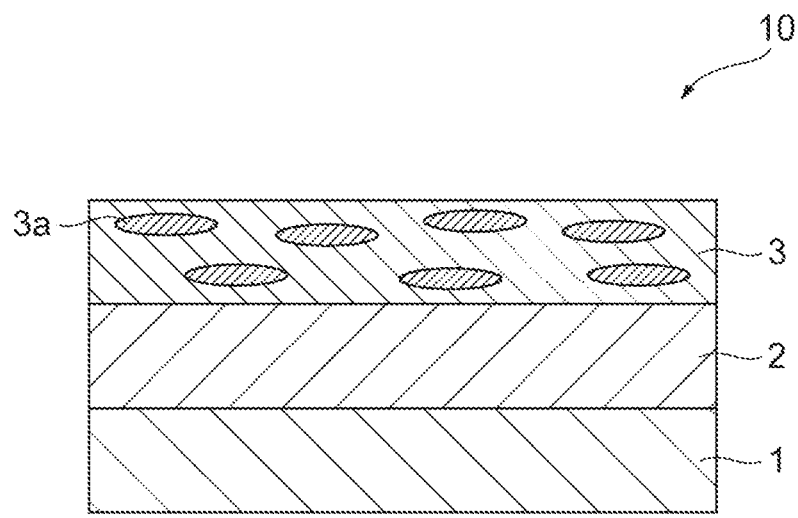
FIG. 1 is a sectional view schematically illustrating one embodiment of a polarizing plate.

The polarizing plate according to the present embodiment comprises a substrate and a polarizer, wherein the polarizer has a polarizing layer having a thickness of 5 μm or less in which a dichroic dye is oriented, and the polarizer has an absorbance (A1) at a wavelength of 380 to 760 nm of 0.3 or more and 1.5 or less in the absorption axis direction and an absorbance (A2) of 0.001 or more and 0.15 or less in the transmission axis direction.

1. Polarizer

The polarizer according to the present embodiment has a polarizing layer having a thickness of 5 μm or less in which a dichroic dye is oriented. This polarizing layer can be formed using a composition comprising a dichroic dye (hereinafter, referred to as "composition for forming a polarizer" in some cases).

1-1. Dichroic Dye

It is preferred that a dichroic dye having absorption at a wavelength in the range of 380 to 800 nm can be used, and it is preferred that an organic dye be used. Examples of the dichroic dye include azo compounds.

As the azo compounds, a dichroic dye (1) having an absorption maximum at a wavelength in the range of 380 to 550 nm can be used. Examples of the dichroic dye (1) include a compound represented by the following formula (1) (hereinafter, referred to as "compound (1)" in some cases). It is preferred that the azobenzene site of the compound (1) have trans geometric isomerism.

[Chemical Formula 1]

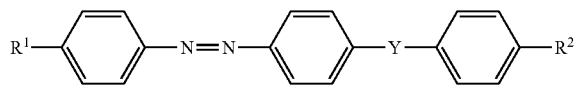
(1)

In the formula (1), Y is a group represented by the following formula (Y1) or (Y2), preferably a group represented by the formula (Y1):

[Chemical Formula 2]

—C—L—
∥
O
(Y1)

—L—C—
∥
O
(Y2)

In the formula (Y1) and the formula (Y2), the straight lines at both ends represent direct links, the direct link on the left bonds to a phenylene group having an azo group, and the direct link on the right bonds to a phenylene group having $R^2$. L is an oxygen atom or —NR—, and R is a hydrogen atom or an alkyl group having 1 to 4 carbon atoms. Examples of the alkyl group include a methyl group, an ethyl group, an n-propyl group, an isopropyl group, an n-butyl group, an isobutyl group, and a t-butyl group. Among these, it is preferred that L be an oxygen atom or —NH—, and it is more preferred that L be an oxygen atom.

$R^1$ is a group represented by the following formula ($R^1$-1), ($R^1$-2), or ($R^1$-3), and is preferably a group represented by the formula ($R^1$-2) or ($R^1$-3). In the formulas, * represents a direct link.

[Chemical Formula 3]

*—NH$_2$
($R^1$-1)

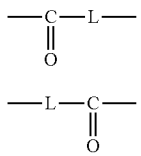
($R^1$-2)

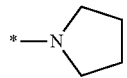
($R^1$-3)

In the group represented by the formula ($R^1$-2), it is preferred that ma's each represent an integer of 0 to 10, and it is more preferred that ma's each represent an integer of 0 to 5. The two ma's may be the same or different, but it is preferred that these be the same.

$R^2$ is a group represented by the formula ($R^2$-1), ($R^2$-2), ($R^2$-3), ($R^2$-4), ($R^2$-5), or ($R^2$-6), it is preferred that $R^2$ be a group represented by the formula ($R^2$-2), ($R^2$-5), or ($R^2$-6), and it is more preferred that $R^2$ be a group represented by the formula ($R^2$-6).

[Chemical Formula 4]

($R^2$-1)

($R^2$-2)

($R^2$-3)

—CF$_3$
($R^2$-4)

($R^2$-5)

($R^2$-6)

In the case where $R^2$ is a group represented by the formula ($R^2$-1), ($R^2$-2), ($R^2$-3), ($R^2$-5), or ($R^2$-6), it is preferred that mb comprised in the group be an integer of 0 to 10, and it is more preferred that mb comprised in the group be an integer of 0 to 5.

Examples of the compound (1) include the compounds represented by the following formulas (1-1) to (1-8):

[Chemical Formula 5]

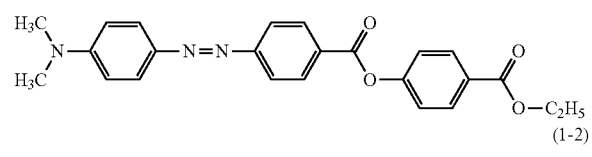
(1-1)

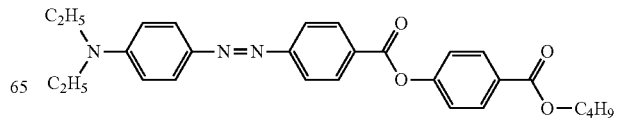
(1-2)

-continued

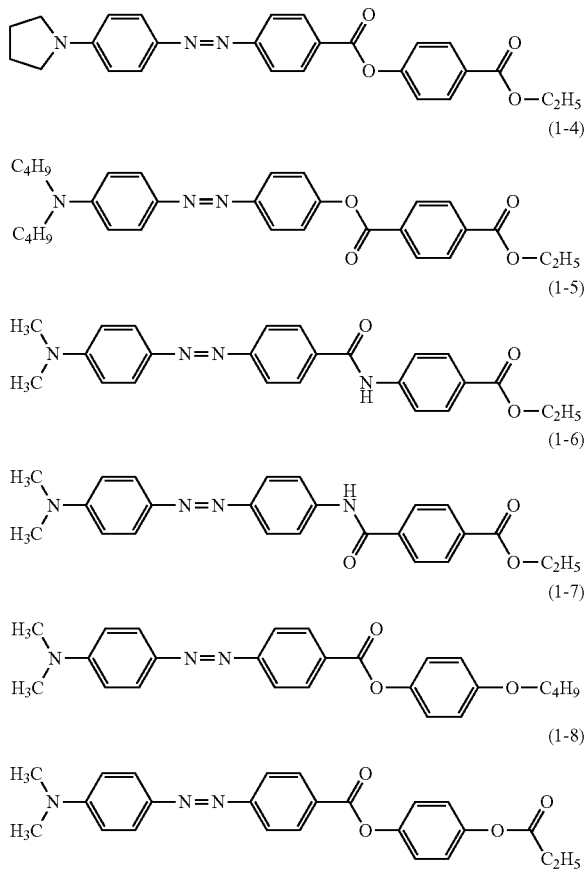

Among these, as the compound (1), the compounds represented by the formulas (1-1), (1-2), (1-3), (1-5), (1-7), and (1-8) are preferred, and the compounds represented by the formulas (1-1), (1-2), (1-3), and (1-7) are more preferred.

Here, a method of producing the compound (1) will be described. The compound (1) can be produced, for example, from a compound [compound (1X)] represented by the formula (1X) and a compound [compound (1Y)] represented by the formula (1Y) by the reaction shown in the following schema:

[Chemical Formula 6]

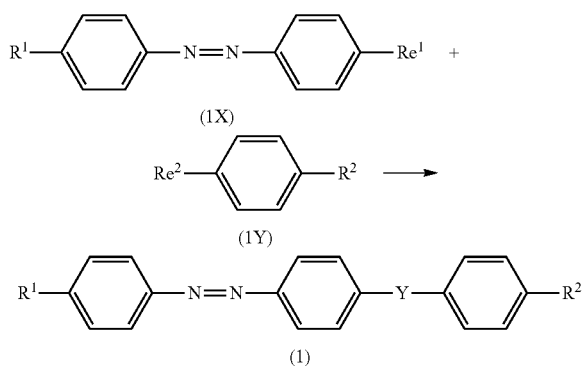

In the above schema, $R^1$, $R^2$ and Y have the same meanings as defined above, and $Re^1$ and $Re^2$ are groups which will react with each other to form a group represented by Y. Examples of the combination of $Re^1$ and $Re^2$ include a combination of a carboxy group and a hydroxyl group, a combination of a carboxy group and an amino group (where the amino group may be replaced by R), a combination of a carbonyl halide group and a hydroxyl group, a combination of a carbonyl halide group and an amino group (where the amino group may be replaced by R), a combination of a carbonyloxyalkyl group and a hydroxyl group, and a combination of a carbonyloxyalkyl group and an amino group (where the amino group may be replaced by R). Examples of R include alkyl groups having 1 to 4 carbon atoms. Moreover, although the compound (1X) having $R^1$ and the compound (1Y) having $R^2$ have been described here, a compound having $R^1$ protected with an appropriate protecting group and a compound having $R^2$ protected with an appropriate protecting group can be reacted with each other, and then an appropriate deprotection reaction can be performed to produce the compound (1).

For the reaction condition when the compound (1X) and the compound (1Y) are reacted, an optimal known condition can be appropriately selected according to the types of the compound (1X) and the compound (1Y).

Examples of the reaction condition when $Re^1$ is a carboxy group, $Re^2$ is a hydroxyl group, and Y is —C(=O)—O— include a condition for condensation in a solvent in the presence of an esterification condensing agent. Examples of the solvent include solvents which can dissolve both of the compound (1X) and the compound (1Y), such as chloroform. Examples of the esterification condensing agent include diisopropylcarbodiimide (IPC). Herein, it is preferred that a base such as dimethylaminopyridine (DMAP) be further used in combination. Although the reaction temperature is selected according to the types of the compound (1X) and the compound (1Y), the reaction temperature is a temperature, for example, in the range of −15 to 70° C., preferably 0 to 40° C. The reaction time is in the range of 15 minutes to 48 hours, for example.

The reaction time can be determined by appropriately sampling the reaction mixture which is being reacted, and checking the degree of loss of the compound (1X) and the compound (1Y) and the degree of generation of the compound (1) by a known analysis unit such as liquid chromatography and gas chromatography.

The compound (1) can be extracted from the reaction mixture after the reaction by a known method such as recrystallization, reprecipitation, extraction, and a variety of chromatographic methods, or a combination of these operations.

As the azo compound, a dichroic dye (2) having an absorption maximum at a wavelength in the range of 550 to 700 nm can be used.

The dichroic dye (2) may comprise a dichroic dye (2-1) having an absorption maximum at a wavelength in the range of 550 to 600 nm and/or a dichroic dye (2-2) having an absorption maximum at a wavelength in the range of 600 to 700 nm. It is more preferred that the dichroic dye (2-1) have an absorption maximum at a wavelength in the range of 570 to 600 nm, and it is more preferred that the dichroic dye (2-2) have an absorption maximum having a wavelength in the range of 600 to 680 nm.

Examples of the dichroic dye (2) include a compound represented by the following formula (2)(hereinafter, referred to as "compound (2)" in some cases). It is preferred that the azobenzene site of the compound (2) have trans geometric isomerism. In the formula (2), n is 1 or 2.

[Chemical Formula 7]

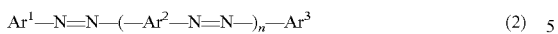

$Ar^1$ and $Ar^3$ each represent a group represented by the formula (AR-1), (AR-2), (AR-3), or (AR-4). * represents a direct link.

[Chemical Formula 8]

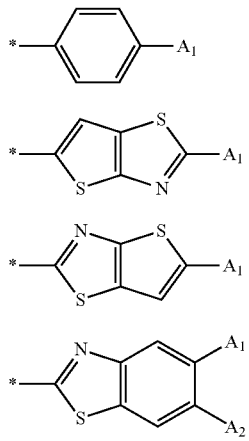

$Ar^2$ is a group represented by the formula (AR2-1), (AR2-2), or (AR2-3).

[Chemical Formula 9]

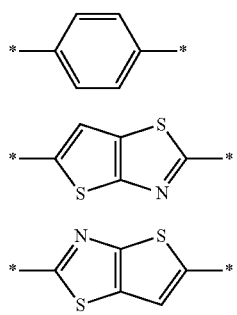

$A_1$ and $A_2$ each represent a group represented by each of the formulas (A-1) to (A-9). In the formulas (A-2), (A-3), (A-5), and (A-6), mc is an integer of 0 to 10; if two mc's are in the same group, these two mc's are the same or different.

[Chemical Formula 10]

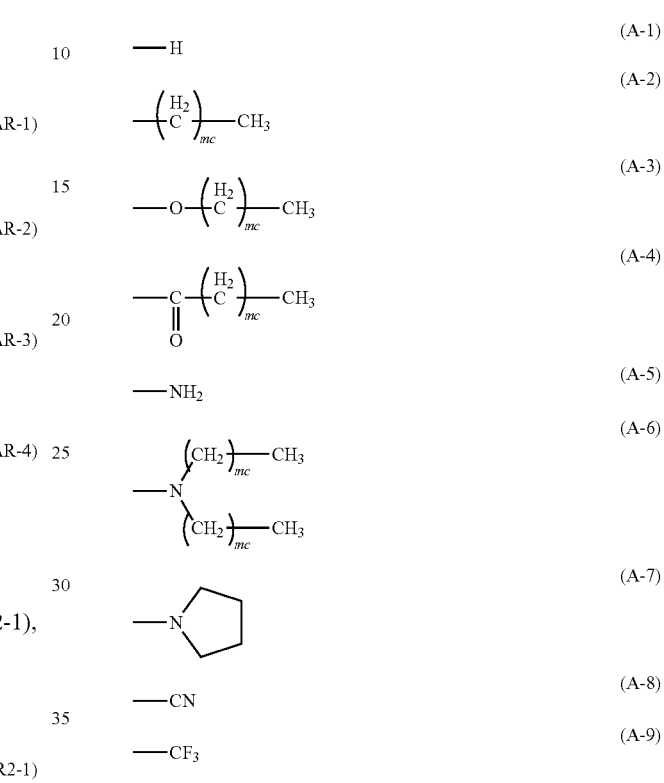

The compound (2) which can be used as the dichroic dye (2-1) is determined by combining $Ar^1$, $Ar^2$, and $Ar^3$ such that the compound (2) has an absorption maximum at a wavelength in the range of 550 to 600 nm. Similarly, the compound (2) which can be used as the dichroic dye (2-2) is determined by combining $Ar^1$, $Ar^2$, and $Ar^3$ such that the compound (2) has an absorption at a wavelength in the range of 600 to 700 nm.

Specifically showing the compound (2), examples thereof include compounds represented by the formulas (2-11) to (2-39).

[Chemical Formula 11]

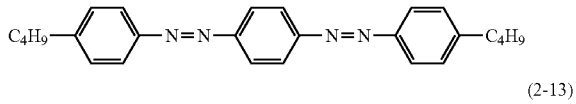
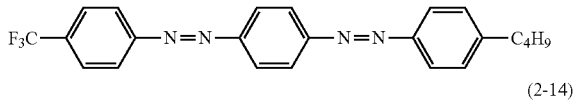
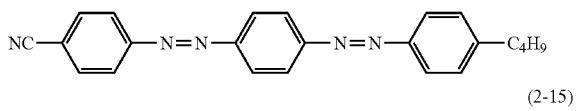
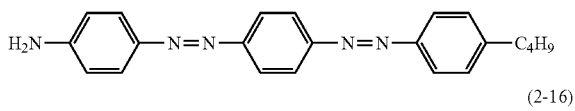

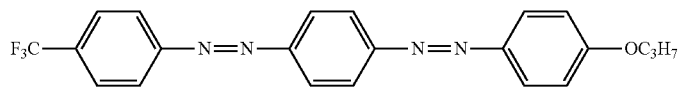
(2-17)
[Chemical Formula 12]
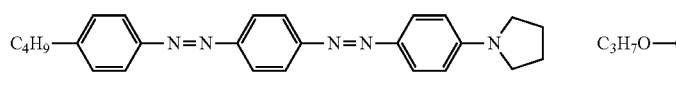
(2-18)
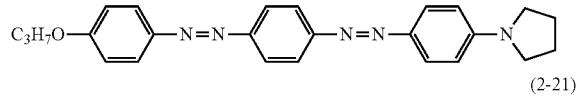
(2-19)
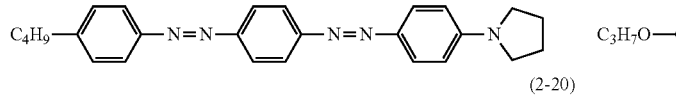
(2-20)
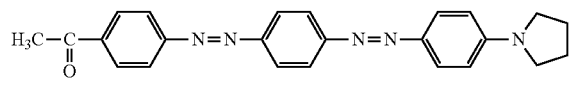
(2-21)
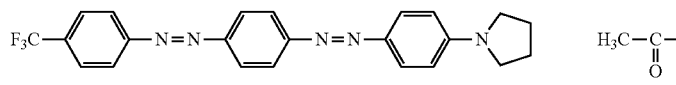
(2-22)
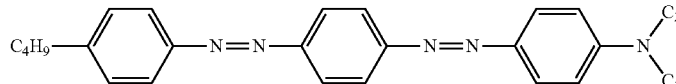
(2-23)
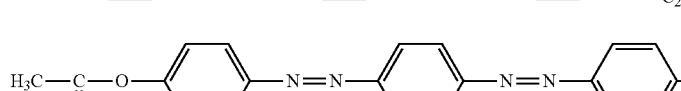
(2-24)
[Chemical Formula 13]
(2-25)
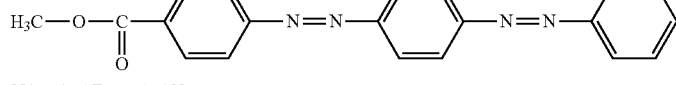
(2-26)
[Chemical Formula 14]
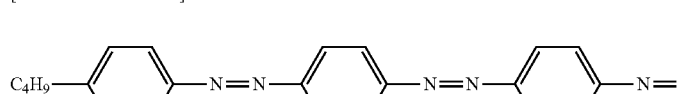
(2-27)
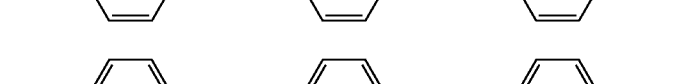
(2-28)
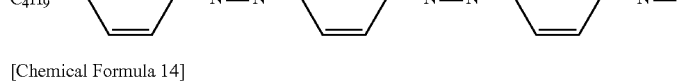
(2-29)
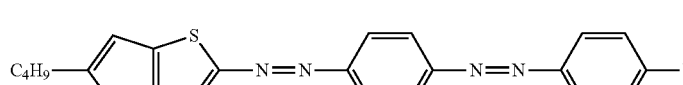
(2-30)
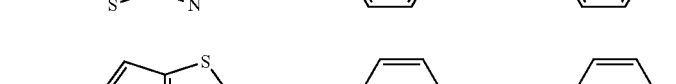
(2-31)
[Chemical Formula 15]
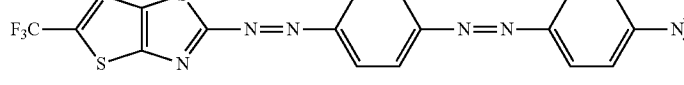
(2-32)

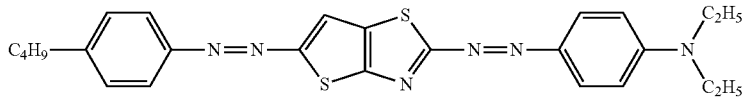

(2-33)

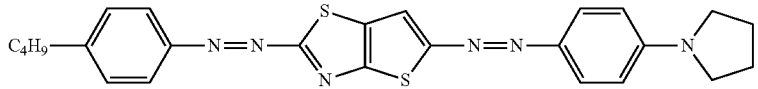

(2-34)

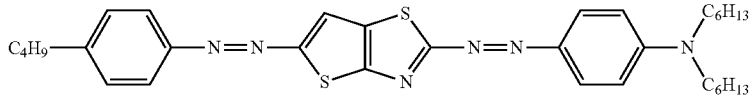

(2-35)

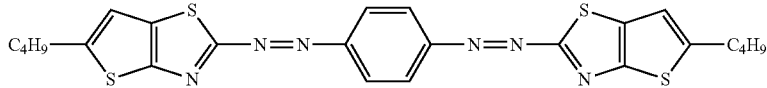

(2-36)

Among the specific examples of the compound (2), the compound represented by the formulas (2-12), (2-13), (2-18), (2-20), (2-21), (2-22), (2-23), (2-24), (2-26), (2-27), (2-28), (2-29), and (2-30) each correspond to the dichroic dye (2-1), and compounds represented by the formulas (2-31), (2-32), (2-33), (2-34), (2-35), and (2-36) each correspond to the dichroic dye (2-2). Although the compounds represented by the formulas (2-11), (2-15), and (2-16) are not a dye having an absorption at a wavelength of 550 to 700 nm, these can be used in combination with another dichroic dye.

Among these specific examples of the compound (2), the compounds represented by the formulas (2-15), (2-16), (2-18), (2-20), (2-21), (2-22), (2-23), (2-27), (2-29), (2-31), (2-32), (2-33), (2-34), and (2-35) are preferred as the dichroic dye (2).

The dichroic dye (2) can be produced, for example, by a known method described in JP 58-38756 A or JP 63-301850 A.

The dichroic dyes described above may be used alone or in combination. In the case where the composition for forming a polarizer contains two or more dichroic dyes, the content of each dichroic dye is preferably 3 parts by mass or less, more preferably 0.1 parts by mass or more and 2.5 parts by mass or less, further more preferably 1 part by mass or more and 1.5 parts by mass or less relative to 100 parts by mass of a polymerizable liquid crystal compound described later. If the content of each dichroic dye is within this range, the dichroic dye(s) in the composition for forming a polarizer has (have) sufficient solubility to the solvent; for this reason, a polarizer having no defect generated is readily obtained when the polarizer is produced using the composition for forming a polarizer. Thereby, a polarizing plate having high light absorbing selectivity and high heat resistance in the form of a thin film is readily produced. The total amount of the dichroic dyes in the composition for forming a polarizer is preferably 9 parts by mass or less, more preferably 0.1 parts by mass or more and 7.5 parts by mass or less, still more preferably 1 part by mass or more and 4.5 parts by mass or less relative to 100 parts by mass of a polymerizable liquid crystal compound described later.

1-2. Polymerizable Liquid Crystal Compound

It is preferred that the polarizer according to the present embodiment have a polarizing layer comprising a polymer of a polymerizable liquid crystal compound. Namely, the composition for forming a polarizer can contain the dichroic dye with the polymerizable liquid crystal compound.

The polymerizable liquid crystal compound is a liquid crystal compound which can be polymerized in the state where it is oriented, and has a polymerizable group in the molecule. The composition for forming a polarizer containing the polymerizable liquid crystal compound font's a cured film by polymerizing the polymerizable liquid crystal compound in the state where the polymerizable liquid crystal compound is oriented. It is particularly preferred that the polymerizable group be a radical polymerizable group. The radical polymerizable group refers to a group related with a radical polymerization reaction.

The polymerizable liquid crystal compound may be a compound having a liquid crystal phase of nematic phase (hereinafter, referred to as "nematic liquid crystal phase" in some cases), a compound having a liquid crystal phase of smectic phase (hereinafter, referred to as "smectic liquid crystal phase" in some cases), or a compound having both of the nematic liquid crystal phase and the smectic liquid crystal phase; a polymerizable smectic liquid crystal compound having at least the smectic liquid crystal phase is preferred. The composition for forming a polarizer comprising the polymerizable smectic liquid crystal compound, with an interaction with the dichroic dye, produces a polarizer having favorable neutral color phase properties and higher polarizing performance.

As the smectic liquid crystal phase of the polymerizable smectic liquid crystal compound, a higher smectic liquid crystal phase is more preferred. The higher smectic liquid crystal phase herein refers to the smectic B phase, the smectic D phase, the smectic E phase, the smectic F phase, the smectic G phase, the smectic H phase, the smectic I phase, the smectic J phase, the smectic K phase, and the smectic L phase; among these, the smectic B phase, the smectic F phase, and the smectic I phase are more preferred.

If the smectic liquid crystal phase of the polymerizable liquid crystal compound is one of these higher smectic liquid crystal phases, a polarizer having a higher orientation order can be produced. Moreover, a polarizer produced from such a higher smectic liquid crystal phase having a higher orientation order exhibits a Bragg peak derived from a higher structure such as a hexatic phase or a crystal phase in the X-ray diffraction measurement. The Bragg peak is a peak derived from a surface periodic structure of a molecular orientation, and according to the composition for forming a polarizer according to the present embodiment, a polarizer having a periodic interval of 3.0 to 5.0 angstroms can be obtained.

Whether the polymerizable liquid crystal compound has a nematic liquid crystal phase or a smectic liquid crystal phase can be verified as follows, for example. An appropriate substrate is prepared, and the composition for forming a polarizer is applied to the substrate to form a coating; then, the workpiece is heat treated or treated under reduced pressure on the condition inhibiting the polymerization of the polymerizable liquid crystal compound to remove the solvent contained in the coating. Subsequently; the liquid crystal phase expressed by heating the coating formed on the substrate to an isotropic temperature, and gradually cooling the coating is examined through observation of the texture with a polarizing microscope, X-ray diffraction measurement, or differential scanning calorimetry. In this examination, for example, a polymerizable liquid crystal compound exhibiting the nematic liquid crystal phase through cooling of the compound and exhibiting the smectic liquid crystal phase through further cooling thereof is particularly preferred. In the nematic liquid crystal phase and the smectic liquid crystal phase, that the polymerizable liquid crystal compound and the dichroic dye are not phase separated can be verified through surface observation with a variety of microscopes or measurement of the degree of scattering with a haze meter, for example.

Examples of the polymerizable liquid crystal compound include a compound represented by the formula (4) (hereinafter, referred to as "compound (4)" in some cases):

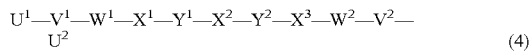

$$U^1-V^1-W^1-X^1-Y^1-X^2-Y^2-X^3-W^2-V^2-U^2 \quad (4)$$

In the formula (4), $X^1$, $X^2$, and $X^3$ each independently represent an optionally substituted 1,4-phenylene group or an optionally substituted cyclohexane-1,4-diyl group. At least one of $X^1$, $X^2$, and $X^3$ is preferably an optionally substituted cyclohexane-1,4-diyl group, and $X^1$ or $X^3$ is particularly preferably an optionally substituted cyclohexane-1,4-diyl group. —$CH_2$— forming the optionally substituted cyclohexane-1,4-diyl group may be replaced by —O—, —S—, or —NR—. R is an alkyl group having 1 to 6 carbon atoms or a phenyl group.

The optionally substituted cyclohexane-1,4-diyl group is preferably an optionally substituted trans-cyclohexane-1,4-diyl group, and more preferably a trans-cyclohexane-1,4-diyl group having no substituent. In the formula (4), at least two of $X^1$, $X^2$, and $X^3$ may be an optionally substituted 1,4-phenylene group, and is preferably a 1,4-phenylene group having no substituent.

Examples of the substituent which the optionally substituted 1,4-phenylene group or the optionally substituted cyclohexane-1,4-diyl group optionally has include alkyl groups having 1 to 4 carbon atoms such as a methyl group, an ethyl group, and a butyl group; a cyano group, and halogen atoms.

In the formula (4), $Y^1$ and $Y^2$ each independently represent —$CH_2CH_2$—, —$CH_2O$—, —COO—, —OCOO—, single bond, —N=N—, —$CR^a$=$CR^b$—, —C≡C—, or —$CR^a$=N—. $R^a$ and $R^b$ each independently represent a hydrogen atom or an alkyl group having 1 to 4 carbon atoms. $Y^1$ is preferably —$CH_2CH_2$—, —COO—, or a single bond; $Y^2$ is preferably —$CH_2CH_2$—, —COO—, or —$CH_2O$—.

In the formula (4), $U^1$ is a hydrogen atom or a polymerizable group, preferably a polymerizable group. $U^2$ is a polymerizable group. $U^1$ and $U^2$ are both preferably a polymerizable group, more preferably a photopolymerizable group. The photopolymerizable group refers to a group which can be involved in a polymerization reaction by an active radical or an acid generated from a photopolymerization initiator described later. It is advantageous that the polymerizable liquid crystal compound having a photopolymerizable group can be polymerized under a condition at lower temperature.

The polymerizable groups of $U^1$ and $U^2$ may be different, but it is preferred that polymerizable groups of $U^1$ and $U^2$ be groups of the same type. Examples of the polymerizable group include a vinyl group, a vinyloxy group, a 1-chlorovinyl group, an isopropenyl group, a 4-vinylphenyl group, an acryloyloxy group, a methacryloyloxy group, an oxiranyl group, and an oxetanyl group. Among these, an acryloyloxy group, a methacryloyloxy group, a vinyloxy group, an oxiranyl group, and an oxetanyl group are preferred, and an acryloyloxy group is more preferred as the polymerizable group.

In the formula (4), $V^1$ and $V^2$ each independently represent an optionally substituted alkanediyl group having 1 to 20 carbon atoms, where —$CH_2$— forming the alkanediyl group may be replaced by —O—, —S—, or —NH—. Examples of the alkanediyl group having 1 to 20 carbon atoms include a methylene group, an ethylene group, a propane-1,3-diyl group, a butane-1,3-diyl group, a butane-1,4-diyl group, a pentane-1,5-diyl group, a hexane-1,6-diyl group, a heptane-1,7-diyl group, an octane-1,8-diyl group, a decane-1,10-diyl group, a tetradecane-1,14-diyl group, and an icosane-1,20-diyl group. $V^1$ and $V^2$ are an alkanediyl group having preferably 2 to 12 carbon atoms, more preferably 6 to 12 carbon atoms. Examples of the substituent that the alkanediyl group having 1 to 20 carbon atoms optionally has can include a cyano group and halogen atoms. It is preferred that the alkanediyl group be not replaced, and it is more preferred that the alkanediyl group be not replaced and be linear.

In the formula (4), $W^1$ and $W^2$ each independently represent a single bond, —O—, —S—, —COO—, or —OCOO—, and $W^1$ and $W^2$ are preferably a single bond or —O—.

Examples of the compound (4) include compounds represented by the formulas (4-1) to (4-43). If a specific example of the compound (4) has a cyclohexane-1,4-diyl group, it is preferred that the cyclohexane-1,4-diyl group be a trans body.

[Chemical Formula 16]

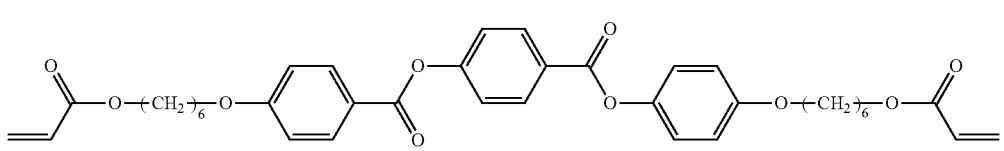

(4-1)

-continued
(4-2)
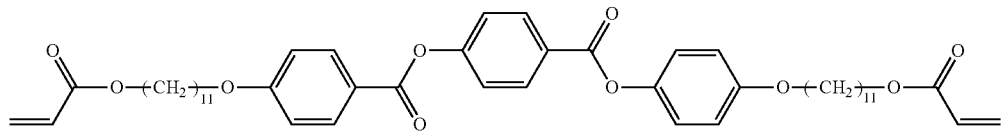
(4-3)
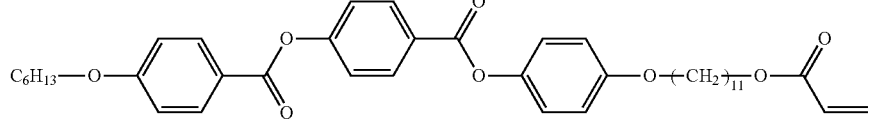
(4-4)
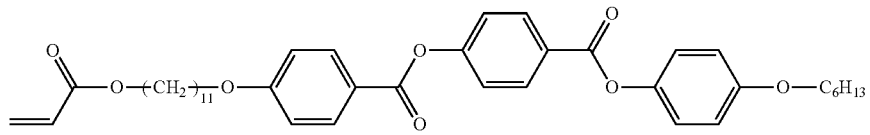
(4-5)
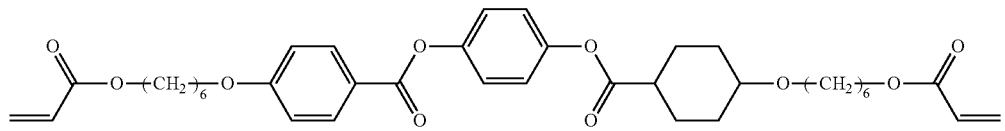
(4-6)
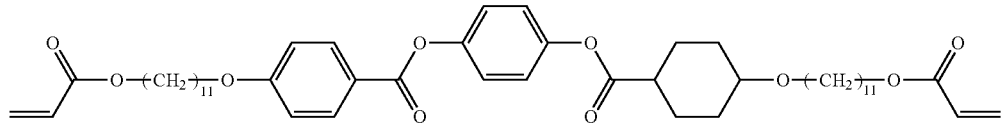
(4-7)
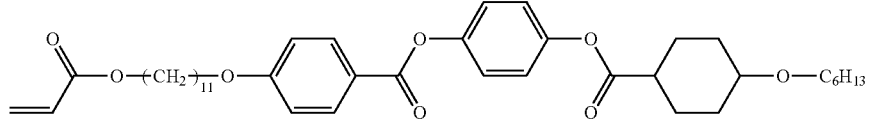
(4-8)
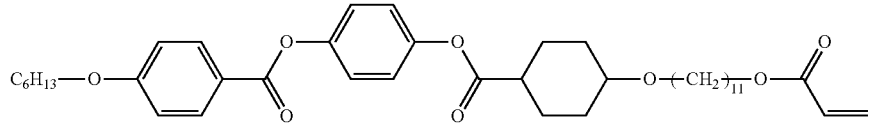
(4-9)
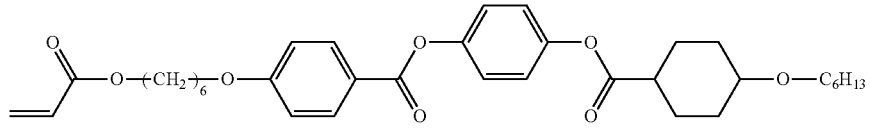
(4-10)
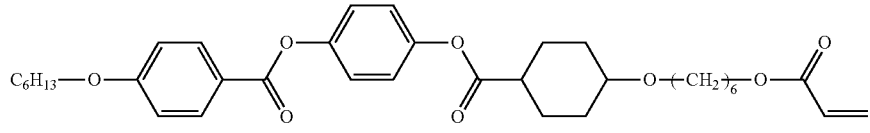
(4-11)
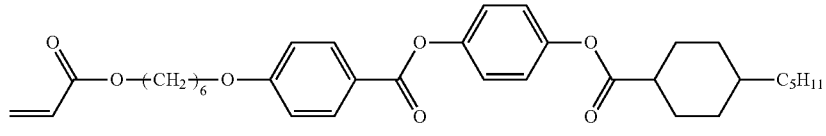
(4-11-2)
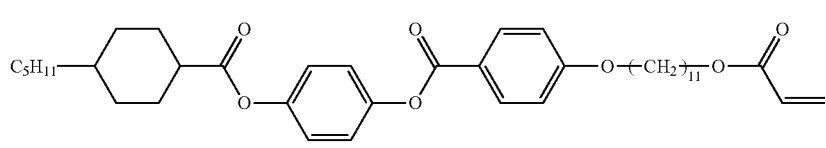

-continued
[Chemical Formula 17]
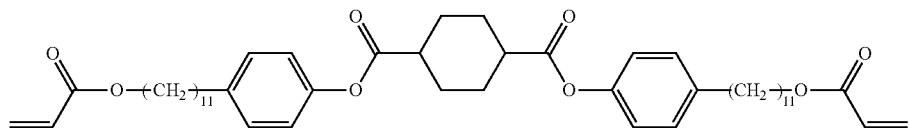
(4-12)
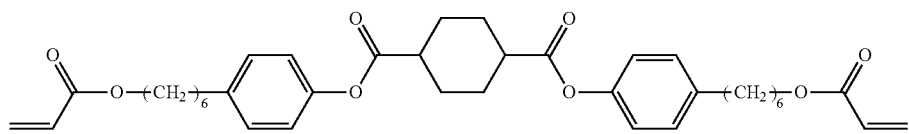
(4-13)
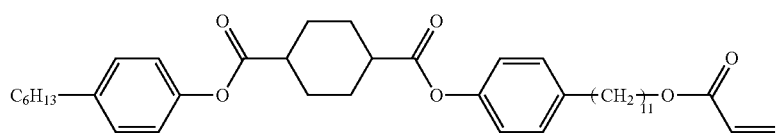
(4-14)
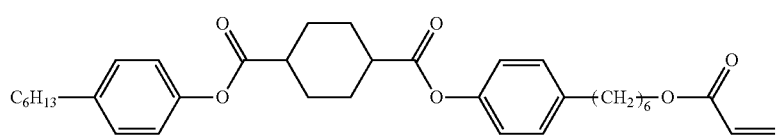
(4-15)
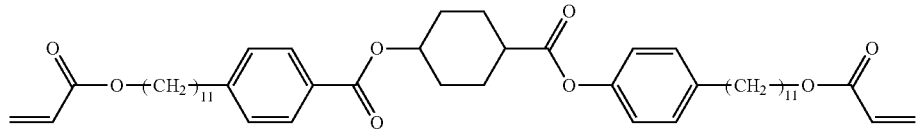
(4-16)
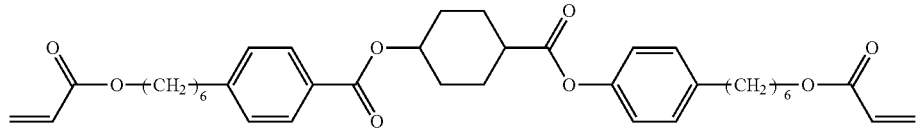
(4-17)
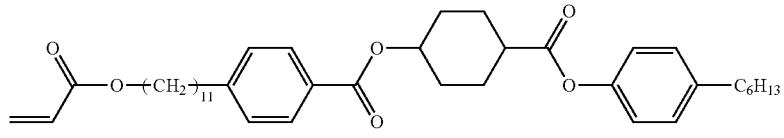
(4-18)
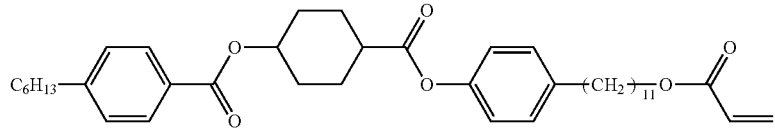
(4-19)
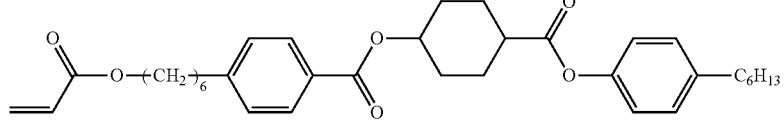
(4-20)
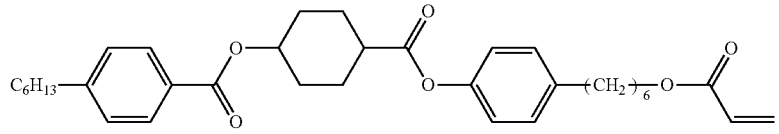
(4-21)

[Chemical Formula 18]
(4-22)
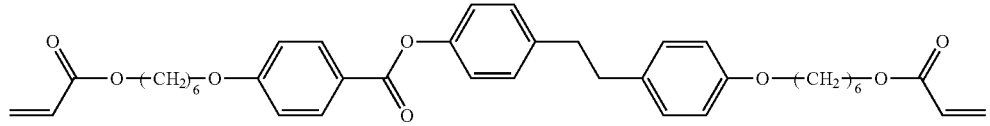
(4-23)
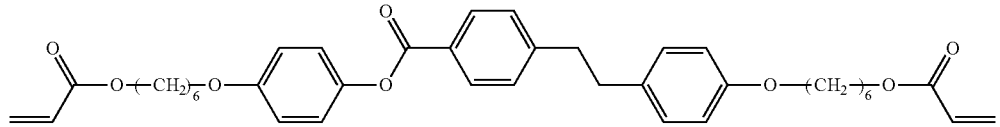
(4-24)
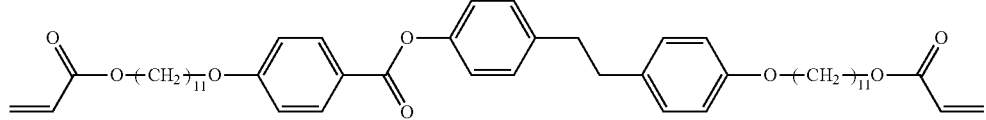
(4-25)
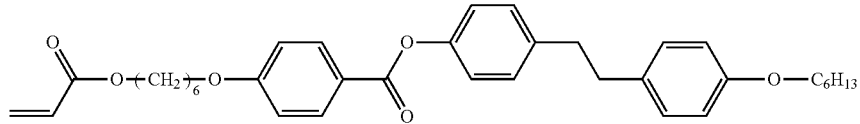
(4-26)
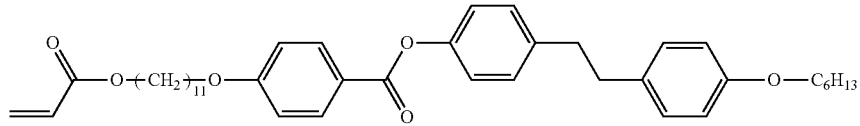
(4-27)
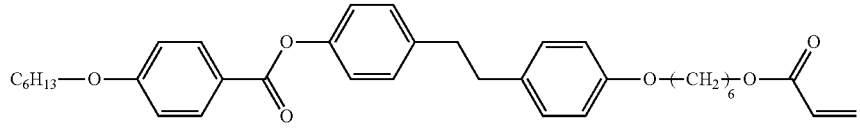
(4-28)
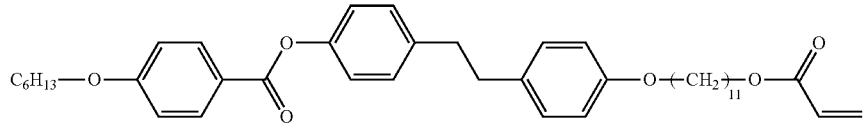
(4-29)
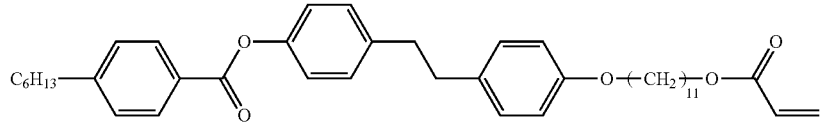
(4-30)
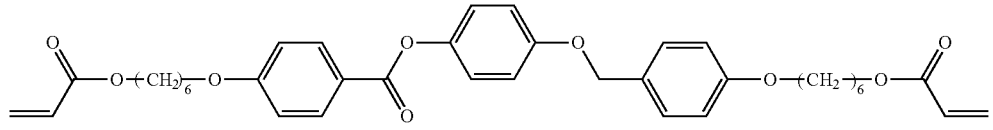
(4-31)
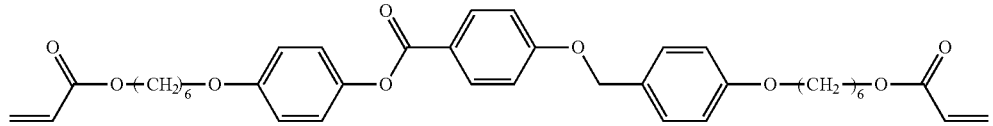
[Chemical Formula 19]
(4-32)
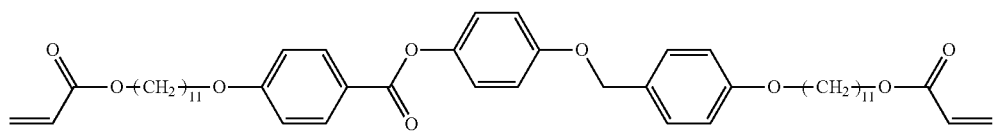

-continued
(4-33)
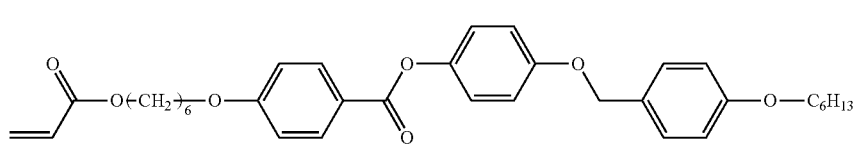
(4-34)
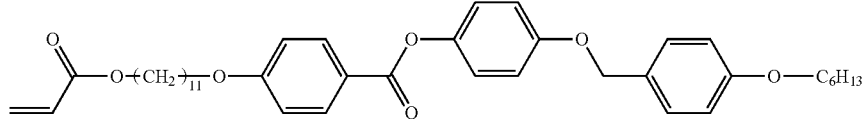
(4-35)
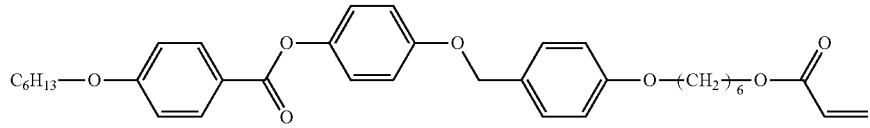
(4-36)
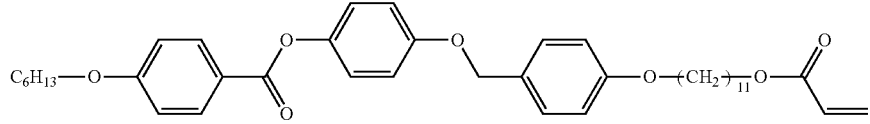
(4-37)
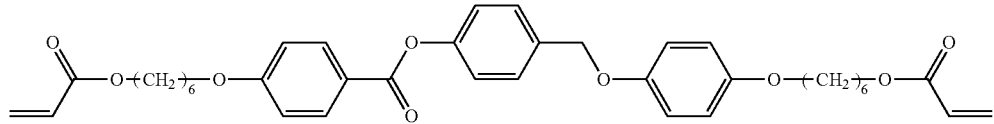
(4-38)
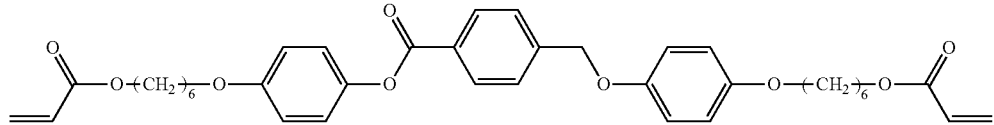
(4-39)
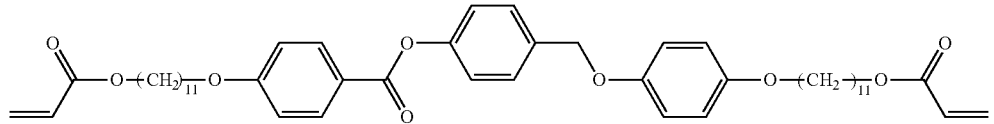
(4-40)
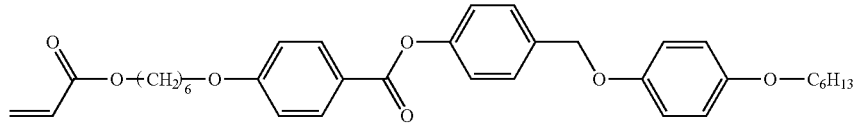
(4-41)
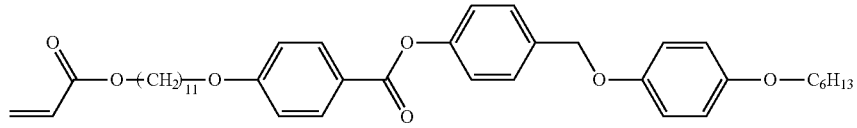
(4-42)
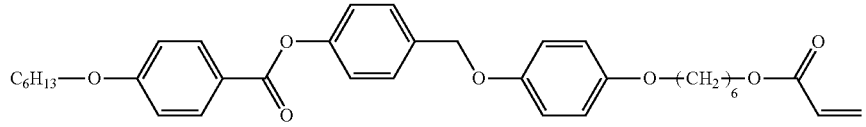
(4-43)
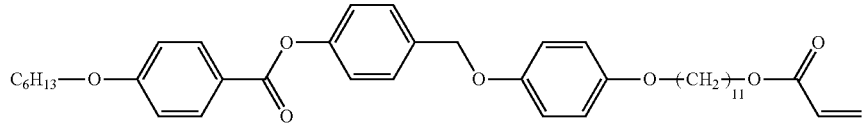

These polymerizable liquid crystal compounds can be used alone or in the form of a mixture thereof in the composition for forming a polarizer. In the case where two or more of the polymerizable liquid crystal compounds are mixed, it is preferred that at least one of them be the compound (4). As the mixing ratio (mass ratio) when two of the polymerizable liquid crystal compounds are mixed, the ratio of polymerizable liquid crystal compound other than the compound (4): compound (4) is usually 1:99 to 50:50, preferably 5:95 to 50:50, more preferably 10:90 to 50:50.

Among these compounds (4), the compounds represented by the formulas (4-5), (4-6), (4-7), (4-8), (4-9), (4-10), (4-11), (4-12), (4-13), (4-14), (4-15), (4-22), (4-24), (4-25), (4-26), (4-27), (4-28), and (4-29) are preferred. By the interaction with another polymerizable liquid crystal compound, these compounds can be readily polymerized under a temperature condition lower than the crystal phase transition temperature thereof; namely, in the stale where the liquid crystal state of a higher smectic phase is sufficiently kept. Specifically, these compounds can be polymerized under a temperature condition of 70° C. or less, preferably 60° C. or less in the state where the liquid crystal state of a higher smectic phase is sufficiently kept.

The proportion of the polymerizable liquid crystal compound contained in the composition for forming a polarizer is preferably 50 to 99.9% by mass, more preferably, 80 to 99.9% by mass relative to the solid content of the composition for forming a polarizer. If the proportion of the polymerizable liquid crystal compound contained is within this range, the orientation properties of the polymerizable liquid crystal compound tend to be enhanced. The solid content refers to the total amount of the component excluding volatility components such as a solvent from the composition for forming a polarizer.

The polymerizable liquid crystal compound can be produced by a known method described in Lub et al. Recl. Trav. Chim. Pays-Bas, 115, 321-328 (1996), or JP 4719156 B, for example.

1-3. Solvent

It is preferred that the composition for forming a polarizer comprises a solvent. As the solvent, a solvent that can completely dissolve the dichroic dye and the polymerizable liquid crystal compound is preferred. Moreover, it is preferred that the solvent be inactive to the polymerization reaction of the polymerizable liquid crystal compound comprised in the composition for forming a polarizer.

Examples of the solvent include alcohol solvents such as methanol, ethanol, ethylene glycol, isopropyl alcohol, propylene glycol, ethylene glycol methyl ether, ethylene glycol butyl ether, and propylene glycol monomethyl ether; ester solvents such as ethyl acetate, butyl acetate, ethylene glycol methyl ether acetate, γ-butyrolactone, propylene glycol methyl ether acetate, and ethyl lactate; ketone solvents such as acetone, methyl ethyl ketone, cyclopentanone, cyclohexanone, 2-heptanone, and methyl isobutyl ketone; aliphatic hydrocarbon solvents such as pentane, hexane, and heptane; aromatic hydrocarbon solvents such as toluene and xylene; nitrile solvents such as acetonitrile; ether solvents such as tetrahydrofuran and dimethoxyethane; and chlorine containing solvents such as chloroform and chlorobenzene. These solvents may be used alone or in combination.

The content of the solvent is preferably 50 to 98% by mass relative to the total amount of the composition for forming a polarizer. In other words, the solid content of the composition for forming a polarizer is preferably 2 to 50% by mass. If the solid content is 2% by mass or more, a polarizing plate having a thin profile, which is one of the objects of the present invention, is readily obtained. Moreover, if the solid content is 50% by mass or less, the viscosity of the composition for forming a polarizer reduces; therefore, the thickness of the polarizer becomes approximately uniform, and unevenness barely occurs in the polarizer. The solid content can be determined in consideration of the thickness of the polarizer.

1-4. Additives

The composition for forming a polarizer according to the present embodiment can optionally comprise additives. Examples of the additives include polymerization initiators, light sensitizers, polymerization inhibitors, and leveling agents.

1-4-1. Polymerization Initiator

It is preferred that the composition for forming a polarizer contain a polymerization initiator. The polymerization initiator is a compound which can initiate the polymerization reaction of the polymerizable liquid crystal compound. As the polymerization initiator, photopolymerization initiators are preferred because these can initiate the polymerization reaction under low temperature conditions. Specifically, compounds which generate an active radical or an acid by the action of light are used as the photopolymerization initiator. Among these photopolymerization initiators, polymerization initiators which generate active radicals by the action of light are more preferred.

Examples of the polymerization initiator include benzoin compounds, benzophenone compounds, alkylphenone compounds, acylphosphine oxide compounds, triazine compounds, iodonium salts, and sulfonium salts.

Examples of the benzoin compounds include benzoin, benzoin methyl ether, benzoin ethyl ether, benzoin isopropyl ether, and benzoin isobutyl ether.

Examples of the benzophenone compounds include benzophenone, methyl o-benzoylbenzoate, 4-phenylbenzophenone, 4-benzoyl-4'-methyldiphenyl sulfide, 3,3',4,4'-tetra(tert-butylperoxycarbonyl)benzophenone, and 2,4,6-trimethylbenzophenone.

Examples of the alkylphenone compounds include oligomers of diethoxyacetophenone, 2-methyl-2-morpholino-1-(4-methylthiophenyl)propane-1-one, 2-benzyl-2-dimethylamino-1-(4-morpholinophenyl)butane-1-one, 2-hydroxy-2-methyl-1-phenylpropane-1-one, 1,2-diphenyl-2,2-dimethoxyethane-1-one, 2-hydroxy-2-methyl-1-[4-(2-hydroxyethoxy)phenyl]propane-1-one, 1-hydroxycyclohexylphenyl ketone, and 2-hydroxy-2-methyl-1-[4-(1-methyl vinyl)phenyl]propane-1-one.

Examples of the acylphosphine oxide compounds include 2,4,6-trimethylbenzoyldiphenylphosphine oxide, and bis(2, 4,6-trimethylbenzoyl)phenylphosphine oxide.

Examples of the triazine compounds include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, and 2,4-bis(trichloromethyl)-6-[2-(3,4-dimethoxyphenyl)ethenyl]-1,3,5-triazine.

Commercially available polymerization initiators can also be used as the polymerization initiator. Examples of the commercially available polymerization initiators include "IRGACURE 907", "IRGACURE 184", "IRGACURE 651", "IRGACURE 819", "IRGACURE 250", and "IRGACURE 369" (BASF Japan Ltd.); "SEIKUOL BZ", "SEIKUOL Z", "SEIKUOL BEE" (Seiko Chemical Co., Ltd.);

"Kayacure BP100" (NIPPON KAYAKU Co., Ltd.); "UVI-6992" (made by Dow Chemical Company); "Adeka OPTOMER SP-152", "Adeka OPTOMER SP-170" (ADEKA Corporation); "TAZ-A" and "TAZ-PP" (DKSH Japan); and "TAZ-104" (SANWA Chemical Co., Ltd.).

In the case where the composition for forming a polarizer contains the polymerization initiator, the content can be appropriately adjusted according to the type and the amount of the polymerizable liquid crystal compound contained in the composition for forming a polarizer; the content of the polymerization initiator relative to the total of 100 parts by mass of the polymerizable liquid crystal compound is usually 0.1 to 30 parts by mass, preferably 0.5 to 10 parts by mass, more preferably 0.5 to 8 parts by mass. If the content of the polymerizable initiator is within this range, the polymerizable liquid crystal compound can be polymerized without disturbing the orientation thereof; for this reason, the content of the polymerizable initiator within this range is preferred.

1-4-2. Light Sensitizer

The composition for forming a polarizer, if containing the photopolymerization initiator, may further contain a light sensitizer. Examples of the light sensitizer include xanthone and xanthone compounds such as thioxanthone (such as 2,4-diethylthioxanthone and 2-isopropylthioxanthone); anthracene and anthracene compounds such as alkoxy group-containing anthracenes (such as dibutoxyanthracene); and phenothiazine and rubrene.

In the case where the composition for forming a polarizer contains the photopolymerization initiator and the light sensitizer, the polymerization reaction of the polymerizable liquid crystal compound contained in the composition for forming a polarizer is more accelerated. The content of the light sensitizer can be appropriately adjusted according to the type and the amount of the photopolymerization initiator and the polymerizable liquid crystal compound used in combination; the content is usually 0.1 to 30 parts by mass, preferably 0.5 to 10 parts by mass, more preferably 0.5 to 8 parts by mass relative to 100 parts by mass of the polymerizable liquid crystal compound.

1-4-3. Polymerization Inhibitor

The composition for forming a polarizer may contain a polymerization inhibitor to stably progress the polymerization reaction of the polymerizable liquid crystal compound. The degree of polymerization reaction of the polymerizable liquid crystal compound can be controlled by the polymerization inhibitor.

Examples of the polymerization inhibitor include radical scavengers such as hydroquinone, alkoxy group-containing hydroquinones, alkoxy group-containing catechols (such as butylcatechol), pyrogallol, and 2,2,6,6-tetramethyl-1-piperidinyloxy radicals; thiophenols; β-naphthylamines, and β-naphthols.

In the case where the composition for forming a polarizer comprises the polymerization inhibitor, the content can be appropriately adjusted according to the type and the amount of the polymerizable liquid crystal compound to be used and the content of the light sensitizer; the content is usually 0.1 to 30 parts by mass, preferably 0.5 to 10 parts by mass, more preferably 0.5 to 8 parts by mass relative to 100 parts by mass of the polymerizable liquid crystal compound. If the content of the polymerization inhibitor is within this range, the polymerizable liquid crystal compound can be polymerized without disturbing the orientation thereof; for this reason, the content of the polymerization inhibitor within this range is preferred.

1-4-4. Leveling Agent

It is preferred that the composition for forming a polarizer contain a leveling agent. The leveling agent has a function to adjust the fluidity of the composition for forming a polarizer to provide a smoother coating obtained by applying the composition for forming a polarizer; examples thereof can include surfactants. Examples of the leveling agent include leveling agents containing polyacrylate compounds as a main component, and leveling agents containing fluorine atom-containing compounds as a main component.

Examples of the leveling agents containing polyacrylate compounds as a main component include "BYK-350", "BYK-352", "BYK-353", "BYK-354", "BYK-355", "BYK-358N", "BYK-361N", "BYK-380", "BYK-381", and "BYK-392" [BYK Chemie GmbH].

Examples of the leveling agents containing fluorine atom-containing compounds as a main component include Megafac "R-08", "R-30", "R-90", "F-410", "F-411", "F-443", "F-445", "F-470", "F-471", "F-477", "F-479", "F-482", and "F-483" [made by DIC Corporation]; Surflon "S-381", "S-382", "S-383", "S-393", "SC-101", "SC-105", "KH-40", and "SA-100"[AGC SEIMI CHEMICAL CO., LTD.]; "E1830", "E5844" [DAIKIN INDUSTRIES, LTD.]; EFTOP "EF301", "EF303", "EF351", and "EF352" [Mitsubishi Materials Electronic Chemicals Co., Ltd.].

In the case where the composition for forming a polarizer contains the leveling agent, the content is usually 0.3 parts by mass or more and 5 parts by mass or less, preferably 0.5 parts by mass or more and 3 parts by mass or less relative to 100 parts by mass of the polymerizable liquid crystal compound. If the content of the leveling agent is within this range, the horizontal alignment of the polymerizable liquid crystal compound tends to be easy, and the resulting polarizer tends to be smoother. If the content of the leveling agent to the polymerizable liquid crystal compound exceeds the range, unevenness tends to be generated in the resulting polarizer. The composition for forming a polarizer may contain two or more leveling agents.

In the polarizer according to the present embodiment, the absorbance (A1) at a wavelength of 380 to 760 nm in the absorption axis direction is 0.3 or more and 1.5 or less, preferably 0.3 or more and 1.0 or less, more preferably 0.33 or more and 0.9 or less, still more preferably 036 or more and 0.85 or less. The absorbance (A2) in the transmission axis direction is 0.001 or more and 0.15 or less, preferably 0.001 or more and 0.10 or less, more preferably 0.002 or more and 0.05 or less, still more preferably 0.005 or more and 0.040 or less.

The absorbances can be appropriately adjusted by adjusting the type of the dichroic dye comprised in the polarizer, the amount of the dichroic dye, or the solid content or the amount applied of the composition for forming a polarizer to control the thickness of the polarizer.

2. Method of Forming Polarizer

A method of forming a polarizer using the composition for forming a polarizer will be described. In such a method, a polarizer is formed by applying the composition for forming a polarizer to a substrate, preferably a transparent substrate.

2-1. Substrate

A transparent substrate refers to a substrate having a transparency which enables transmission of light, particularly visible light. The transparency refers to properties that the transmittance to light beams at a wavelength ranging from 380 to 780 nm is 80% or more. Specifically, examples of the transparent substrate can include glass substrates and plastic substrates; the transparent substrate is preferably a plastic substrate. Examples of the plastics forming the plastic substrates include polyolefins such as polyethylene, polypropylene, and norbornene-based polymers; cyclic olefin resins; poly(vinyl alcohol); poly(ethylene terephthalate); polymethacrylic acid esters; polyacrylic acid esters; cellulose esters such as triacetyl cellulose, diacetyl cellulose, and cellulose acetate propionate; poly(ethylene naphthalate); polycarbonate; polysulfone; polyethersulfone; poly (ether ketone); poly(phenylene sulfide), and poly(phenylene oxide). Among these, especially preferred is cellulose ester, cyclic olefin resins, poly(ethylene terephthalate), or polymethacrylic acid ester because these are easily available from the market or has high transparency. A support substrate may be bonded to the transparent substrate because the transparent substrate is easily handled during manufacturing of the polarizer without generating breakage of the transparent substrate during transportation or storage of the transparent substrate. Moreover, as described later, retardation properties may be given to the plastic substrate during manufacturing of a circularly polarizing plate from a polarizer. In this case, the retardation properties may be given by stretching the plastic substrate.

In the case where the retardation properties are given to the plastic substrate, a plastic substrate composed of cellulose ester or a cyclic olefin resin is preferred because the retardation value is readily controlled.

The cellulose ester is a compound having at least part of hydroxyl groups comprised in cellulose subjected to acetic acid esterification. Cellulose ester films composed of such cellulose esters are easily available from the market. Examples of commercially available triacetyl cellulose films include "Fujitac film" (FUJIFILM Corporation; and "KC8UX2M", "KC8UY", and "KC4UY" (Konica Minolta Opto Products Co., Ltd.). Such commercial triacetyl cellulose films can be used as the transparent substrate as they are, or when necessary, after the retardation properties are given. Moreover, after the surface of the transparent substrate prepared may be subjected to a surface treatment such as an anti-glare treatment, a hardcoat treatment, a charge prevention treatment, or a reflection prevention treatment, the transparent substrate prepared can be used as a transparent substrate.

As described above, a method of stretching a plastic substrate can be used to give the retardation properties to the plastic substrate. All of the plastic substrates composed of thermoplastic resins can be subjected to the stretch treatment; plastic substrates composed of cyclic olefin resins are more preferred because the retardation properties are readily controlled. The cyclic olefin resins refer to resins composed of polymers or copolymers of cyclic olefins such as norbornene and polycyclic norbornene-based monomers. The cyclic olefin resin may partially comprise a ring opened portion, or a cyclic olefin resin comprising a ring opened portion may be hydrogenated. The cyclic olefin resin may be a copolymer of a cyclic olefin and a linear olefin or a vinylated aromatic compound (such as styrene), for example, because the transparency is not remarkably impaired and the moisture absorbing properties are not remarkably increased. Moreover, the cyclic olefin resin may have a polar group introduced into the molecule.

In the case where the cyclic olefin resin is a copolymer of a cyclic olefin and a linear olefin or an aromatic compound having a vinyl group, examples of the linear olefin include ethylene and propylene, and examples of the vinylated aromatic compound include styrene, α-methylstyrene, and alkyl-substituted styrene. In such a copolymer, the proportion of the content of the structural unit derived from the cyclic olefin is in the range of 50 mol % or less, for example, about 15 to 50 mol % relative to all of the structural units of the cyclic olefin resin. In the case where the cyclic olefin resin is a ternary copolymer obtained from a cyclic olefin, a linear olefin, and a vinylated aromatic compound, for example, the proportion of the content of the structural unit derived from the linear olefin is about 5 to 80 mol % relative to all of the structural units of the cyclic olefin resin, and the proportion of the content of the structural unit derived from the vinylated aromatic compound is about 5 to 80 mol %. Such a ternary copolymer cyclic olefin resin has an advantage that the amount of expensive cyclic olefin to be used can be relatively reduced during manufacturing of the cyclic olefin resin.

The cyclic olefin resins are easily available from the market. Examples of the commercially available cyclic olefin resins include "Topas" [Ticona GmbH (Germany)]; "ARTON" [JSR Corporation]; "ZEONOR" and "ZEONEX" [ZEON Corporation]; and "APEL" [made by Mitsui Chemicals, Inc.]. Such a cyclic olefin resin can be formed into a film (cyclic olefin resin film) by a known film forming unit such as solvent casting or melt extrusion. Moreover, cyclic olefin resin films already commercially available in the form of a film can also be used. Examples of the commercially available cyclic olefin resin films include "Esushina" and "SCA40"[SEKISUI CHEMICAL CO., LTD.]; "ZEONOR films" [Optes K. K.]; and "ARTON films" [JSR Corporation].

Subsequently, a method of giving the retardation properties to the plastic substrate will be described. The retardation properties can be given to the plastic substrate by a known stretching method. For example, a roll (winding body) around which the plastic substrate is wound in the form of a roll is prepared; the plastic substrate is continuously fed from the winding body, and the fed plastic substrate is conveyed to a heating furnace. The setting temperature of the heating furnace is in the range of a temperature near the glass transition temperature of the plastic substrate (° C.) to [glass transition temperature +100] (° C.), preferably a temperature near the glass transition temperature (° C.) to [glass transition temperature +50] (° C.). In the heating furnace, a monoaxial or biaxial heat stretching treatment is performed through adjustment of the conveying direction or tension with an inclination at any angle during stretching in the traveling direction of the plastic substrate or a direction orthogonal to the traveling direction. The stretch ratio is usually in the range of about 1.1 to 6, preferably about 1.1 to 3.5. Moreover, a method of stretching the plastic substrate in an oblique direction is not particularly limited as long as the method can continuously incline the orientation axis at a desired angle; a known stretching method can be used. Examples of such a stretching method can include methods described in JP 50-83482 A and JP 02-113920 A.

It is preferred that the thickness of the transparent substrate be thinner because of a weight enabling practical handling and ensuring sufficient transparency; however, if the transparent substrate is excessively thin, the strength tends to be reduced, resulting in inferior processability. The appropriate thickness of the glass substrate is, for example, about 100 to 3000 µm, preferably about 100 to 1000 µm. The appropriate thickness of the plastic substrate is, for example, about 5 to 300 µm, preferably about 20 to 200 µm. It is preferred that the thickness of the transparent substrate in the case where the polarizing plate according to the present embodiment is used as a circularly polarizing plate described later, particularly as a circularly polarizing plate in applications to mobiles be about 20 to 100 µm. In the case where the retardation properties are given to the film by stretching, the thickness after stretching is determined according to the thickness before stretching or the stretch ratio.

FIG. 1 is a sectional view schematically illustrating one embodiment of a polarizing plate 10 according to the present invention.

The polarizing plate 10 includes a substrate 1, and a polarizer (polarizing layer) 3 disposed on the substrate 1. In the polarizer 3, a dichroic dye 3a is oriented. An oriented layer 2 described later may be formed on the substrate 1.

2-2. Orientation Layer

It is preferred that an oriented layer be formed on the substrate used in manufacturing of the polarizer. In this case, the composition for forming a polarizer is applied onto the oriented layer. For this reason, it is preferred that the oriented layer have solvent resistance so as not to dissolve by application of the composition for forming a polarizer. Moreover, it is preferred that the oriented layer have heat resistance in a heat treatment for removal of the solvent and orientation of liquid crystals. The oriented layer can be formed of an orienting polymer.

Examples of the orienting polymer include polyamide, gelatins, polyimide, polyamic acid, poly(vinyl alcohol), alkyl-modified poly(vinyl alcohol), polyacrylamide, polyoxazole, polyethyleneimine, polystyrene, polyvinylpyrrolidone, polyacrylic acid, and polyacrylic acid esters. Among these, poly(vinyl alcohol) is preferred. These orienting polymers may be used alone or in the form of a mixture thereof.

The orienting polymer can be applied onto the substrate as an orienting polymer composition which the orienting polymer is dissolved in a solvent (solution comprising the orienting polymer) to form an oriented layer on the substrate. Examples of the solvent include water; alcohol solvents such as methanol, ethanol, ethylene glycol, isopropyl alcohol, propylene glycol, methyl cellosolve, butyl cellosolve, and propylene glycol monomethyl ether; ester solvents such as ethyl acetate, butyl acetate, ethylene glycol methyl ether acetate, γ-butyrolactone, propylene glycol methyl ether acetate and ethyl lactate; ketone solvents such as acetone, methyl ethyl ketone, cyclopentanone, cyclohexanone, methyl amyl ketone, and methyl isobutyl ketone; aliphatic hydrocarbon solvents such as pentane, hexane and heptane; aromatic hydrocarbon solvents such as toluene and xylene, nitrile solvents such as acetonitrile; ether solvents such as tetrahydrofuran and dimethoxyethane; and chlorine-substituted hydrocarbon solvents such as chloroform and chlorobenzene. These solvents can be used alone or in combination.

As the orienting polymer composition, a commercially available oriented film material may be used as it is. Examples of the commercially available oriented film material include SUNEVER (registered trademark, made by Nissan Chemical Industries, Ltd.) and OPTOMER (registered trademark, made by JSR Corporation).

Examples of the method of forming an oriented layer on a substrate include a method of applying an orienting polymer composition or a commercially available oriented film material onto a substrate, and annealing the coating. The thickness of the thus-obtained oriented layer is usually in the range of 10 nm to 10000 nm, preferably 10 nm to 1000 nm.

To give an orientation restraining force to the oriented layer, when necessary, performing rubbing (rubbing method) is preferred. By giving the orientation restraining force, the polymerizable liquid crystal compound can be oriented in a desired direction.

Examples of the method of giving an orientation restraining force by the rubbing method include a method of preparing a rotating rubbing roll wrapped with a rubbing cloth, placing a laminate composed of a substrate and a coating for forming an oriented layer formed on the substrate on a stage, and conveying the laminate to the rotating rubbing roll to contact the coating for forming an oriented layer with the rotating rubbing roll.

The oriented layer may be a photo-oriented layer. The photo-oriented layer refers to an oriented layer having an orientation restraining force given by applying a composition comprising a polymer or monomer having a photoreactive group and a solvent (hereinafter, referred to as "composition for forming a photo-oriented layer" in some cases) to a substrate, and irradiating the coating with polarized light (preferably, polarized UV). The photoreactive group refers to a group in which a liquid crystal orientation ability is generated through irradiation of light. Specifically, the photoreactive group refers to a group which triggers orientation induction of molecules generated through irradiation of light or a photoreaction causing the liquid crystal orientation ability such as an isomerization reaction, a dimerization reaction, a photocrosslinking reaction, or a photodecomposition reaction. A photoreactive group triggering a dimerization reaction or a photocrosslinking reaction is preferred because its orientation is high, and the smectic liquid crystal state in the formation of the polarizer is kept. As the photoreactive group, groups having unsaturated bond, particularly double bond are preferred, and groups having at least one selected from the group consisting of groups having carbon-carbon double bond (C=C bond), carbon-nitrogen double bond (C=N bond), nitrogen-nitrogen double bond (N=N bond), and carbon-oxygen double bond (C=O bond) are more preferred.

Examples of the photoreactive groups having C=C bond include a vinyl group, a polyene group, a stilbene group, a stilbazole group, a stilbazolium group, a chalcone group, and a cinnamoyl group. Examples of the photoreactive groups having C=N bond include groups having a structure such as an aromatic Schiff base and an aromatic hydrazone. Examples of the photoreactive groups having N=N bond include an azobenzene group, an azonaphthalene group, an aromatic heterocyclic azo group, a bisazo group, a formazan group and groups having azoxybenzene as a basic structure. Examples of the photoreactive groups having C=O bond include a benzophenone group, a coumarin group, an anthraquinone group, and a maleimide group. These groups may have a substituent such as an, alkyl group, an alkoxy group, an aryl group, an allyloxy group, a cyano group, an alkoxycarbonyl group, a hydroxyl group, a sultanate group, or an alkyl halide group. Among these, photoreactive groups which can cause the photodimerization reaction are preferred, and a cinnamoyl group and a chalcone group are preferred because the irradiation intensity of polarized light needed for photo-orientation is relatively low and a photo-oriented layer having high thermal stability and stability over time is obtained. Furthermore, as a polymer having a photoreactive group, a polymer having a cinnamoyl group in which the terminal site of the polymer side chain has a cinnamic acid structure is more preferred.

As the solvent for the composition for forming a photo-oriented layer, solvents which dissolve polymers and monomers having a photoreactive group are preferred; examples of the solvent for the composition for forming a photo-oriented layer include the solvents used in the orienting polymer composition described above.

The content of the polymer or monomer having a photoreactive group in the composition for forming a photo-oriented layer can be appropriately adjusted according to the type of the polymer or monomer having a photoreactive group or the thickness of the photo-oriented layer to be manufactured; in terms of the solid content, at least 0.2% by mass is preferred, and the range of 0.3 to 10% by mass is more preferred. A polymer material, such as polyvinyl alcohol) or polyimide, or a light sensitizer may be comprised in the composition for forming a photo-oriented layer in the range not remarkably impairing the properties of the photo-oriented layer.

As a method of applying the orienting polymer composition or the composition for forming a photo-oriented layer onto a substrate, a known method is used, for example, a coating method such as spin coating, extrusion, gravure coating, die coating, bar coating, and an applicator method, or a printing method such as flexography. In the case where the manufacturing of the polarizer is performed by a roll-to-roll continuous manufacturing method, as an application method, usually, gravure coating, die coating, or a printing method such as flexography is used.

If masking is performed when rubbing or irradiation with polarized light is performed, a plurality of regions (patterns) having different orientation directions can also be formed.

2-3. Method of Manufacturing Polarizing Plate

The composition for forming a polarizer is applied onto the substrate or the oriented layer formed on the substrate to obtain the coating. Examples of the method of applying the composition for forming a polarizer include the same methods as those exemplified as the method of applying the orienting polymer composition or composition for forming a photo-oriented layer onto the substrate.

Next, a dry coating film is formed by drying and removing the solvent on the condition in which the polymerizable liquid crystal compound comprised in the coating is not polymerized. Examples of the drying method include spontaneous drying, air blow drying, drying by heating, and drying under reduced pressure.

As a preferred form, the liquid crystal state of the polymerizable liquid crystal compound comprised in the dry coating film is once converted into nematic liquid crystals, and then the nematic liquid crystal phase is transited to the smectic liquid crystal phase. To form the smectic liquid crystal phase through the nematic liquid crystal phase, a method of heating the polymerizable liquid crystal compound comprised in the dry coating film to a temperature showing the nematic liquid crystal phase or higher, and then cooling the polymerizable liquid crystal compound to a temperature showing the smectic liquid crystal phase is used, for example.

In the case where the polymerizable liquid crystal compound in the dry coating film is converted into the smectic liquid crystal phase or the polymerizable liquid crystal compound is converted into the smectic liquid crystal phase through the nematic liquid crystal phase, the condition to control the liquid crystal state (heating condition) can be determined by measuring the phase transition temperature of the polymerizable liquid crystal compound. The measurement condition of the phase transition temperature will be described in Examples of this specification.

Next, a polymerization step of the polymerizable liquid crystal compound will be described. Here, a method of containing a photopolymerization initiator in the composition for forming a polarizer, converting the liquid crystal state of the polymerizable liquid crystal compound in the dry coating film into the smectic liquid crystal phase, and photopolymerizing the polymerizable liquid crystal compound while keeping the liquid crystal state of the smectic liquid crystal phase will be described in detail.

The light with which the dry coating film is irradiated in the photopolymerization is appropriately selected from the group consisting of visible light, ultraviolet light, laser light, and active electron beams according to the type of photopolymerization initiator comprised in the dry coating film, the type of the polymerizable liquid crystal compound (particularly, the type of polymerizable group which the polymerizable liquid crystal compound has), and the amount thereof. Among these, ultraviolet light is preferred because the progress of the polymerization reaction is easy to control and apparatuses widely used in the field as an apparatus according to photopolymerization can be used. Accordingly, it is preferred that the types of the polymerizable liquid crystal compound and the photopolymerization initiator contained in the composition for forming a polarizer be selected so as to enable photopolymerization using ultraviolet light. Moreover, when the polymerizable liquid crystal compound is polymerized, the polymerization temperature can be also controlled by cooling the dry coating film by the irradiation with ultraviolet light and a cooling unit. Even if a substrate having relatively low heat resistance is used, an advantage is provided by use of such a cooling unit as long as the polymerization of the polymerizable liquid crystal compound can be performed at lower temperature, in that a polarizer can be appropriately formed. A patterned polarizer can be also obtained by performing masking or developing during the photopolymerization.

By performing the photopolymerization described above, the polymerizable liquid crystal compound is polymerized while keeping the nematic liquid crystal phase or the smectic liquid crystal phase, preferably, the higher smectic liquid crystal phase already exemplified, forming a polarizer. The polarizer obtained by polymerizing the polymerizable liquid crystal compound while the smectic liquid crystal phase is kept has an advantage in that this polarizer has higher polarization performance than that of a conventional host-guest polarizer, namely, a polarizer obtained by polymerizing the polymerizable liquid crystal compound while the liquid crystal state of the nematic liquid crystal phase is kept. Furthermore, the polarizer has an advantage in that the strength is higher than that of a polarizer in which only a lyotropic dichroic dye is applied.

The thickness of the polarizer is in the range of preferably 0.5 μm or more and 5 μm or less, more preferably 1 μm or more and 5 or less. Accordingly, the thickness of the coating for forming a polarizer is determined in consideration of the thickness of the polarizer obtained. The thickness of the polarizer can be determined by measurement with an interference film thickness meter, a laser microscope, or a stylus type film thickness meter.

It is particularly preferred that the formed polarizer be a polarizer which obtains the Bragg peak in the X-ray diffraction measurement as described above. Examples of the polarizer which obtains the Bragg peak include polarizers showing a diffraction peak derived from a hexatic phase or a crystal phase.

The polarizer according to the present embodiment has favorable neutral color phase properties. The polarizer having favorable neutral color phase properties is a polarizer in which the color coordinates a* value and b* value in the L*a*b*(Lab) color system satisfy the relationships represented by the following formulas (1F) and (2F).

$$-3 \leq \text{chromaticity } a^* \leq 3 \quad (1F)$$

$$-3 \leq \text{chromaticity } b^* \leq 3 \quad (2F)$$

The color coordinates a* value and b* value are also referred to as "chromaticity a*" and "chromaticity b*", respectively. As both of the values a* and b* is closer to 0 (zero), it is determined that the polarizer is a polarizer showing a neutral color phase. A colorless, favorable, white display is obtained in display devices including such a polarizer.

It is more preferred in the color phase of the polarizer if two polarizers are overlaid such that their absorption axes are orthogonal to each other, the color phase at this time is determined in the same manner as above, the "orthogonal a*" and "orthogonal b*" are calculated, and the orthogonal a* and the orthogonal b* satisfy the relationships represented by the following formulas (1F') and the formula (2F'). The orthogonal a* and the orthogonal b* are indices indicating whether the color phase of a black display is neutral or not in a display device including the polarizer. As the orthogonal a* and the orthogonal b* are both closer to 0 (zero), a colorless, favorable black display is obtained.

$$-3 \leq \text{orthogonal } a^* \leq 3 \quad (1F')$$

$$-3 \leq \text{orthogonal } b^* \leq 3 \quad (2F')$$

When polarizers are commercially manufactured, a method which can continuously form polarizers is required. Such a continuous manufacturing method is of a roll-to-roll system, and is referred to as "the present manufacturing method" in some cases. In the present manufacturing method, a case where the substrate is a transparent substrate will be mainly described. In the case where the substrate is a transparent substrate, the final product is a polarizing plate including a transparent substrate and a polarizer.

The present manufacturing method comprises, for example, a step of preparing a first roll in which a transparent substrate is wound around a first roll core, a step of continuously feeding the transparent substrate from the first roll, a step of continuously forming an oriented layer on the transparent substrate, a step of continuously applying a composition for forming a polarizer onto the oriented layer, a step of continuously forming a dry coating film on the oriented layer by drying the applied composition for forming a polarizer on a condition in which the polymerizable liquid crystal compound is not polymerized, a step of converting the polymerizable liquid crystal compound comprised in the dry coating film into a nematic liquid crystal phase, preferably a smectic liquid crystal phase, and polymerizing the polymerizable liquid crystal compound while keeping the smectic liquid crystal phase to continuously obtain a film to form a polarizer, and a step of winding the continuously obtained polarizer around a second roll core to obtain a second roll.

The polarizing plate obtained by the present manufacturing method is a film shape and elongate polarizing film. The polarizing plate, if used in liquid crystal display devices described later, are cut into a desired size according to the scale of the liquid crystal display device used.

While the polarizing plate can be in the form of a laminate of transparent substrate/photo-oriented layer/polarizer, the polarizer can be also obtained as a single layer by releasing the photo-oriented layer and the transparent substrate. Moreover, the polarizing plate may have a form composed of a laminate of layers or films other than transparent substrate/photo-oriented layer/polarizer. As these layers or films, the polarizing plate may further include a retardation film, or may further include an anti-reflective layer or a luminance enhanced film.

Figure 2:
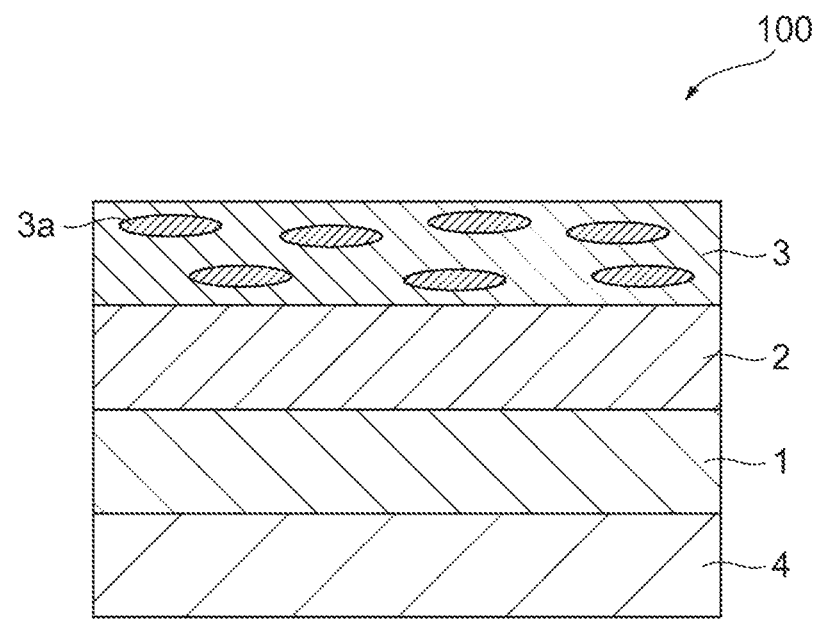
FIG. 2 is a sectional view schematically illustrating one embodiment of a circularly polarizing plate.
Figure 3:
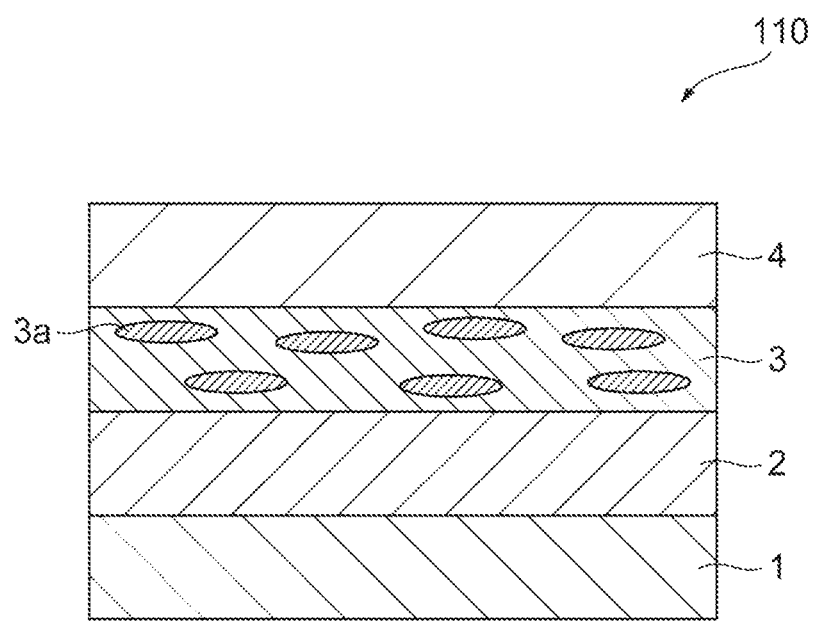
FIG. 3 is a sectional view schematically illustrating one embodiment of a circularly polarizing plate.

For example, the polarizing plate according to the present embodiment is a circularly polarizing plate if a ¼ wavelength plate is comprised. FIG. 2 is a sectional view schematically illustrating one embodiment of a circularly polarizing plate 100 according to the present invention. The circularly polarizing plate 100 can comprise a substrate 1 having an oriented layer 2 formed thereof, a polarizer 3 disposed on the oriented layer 2, and a retardation film 4 disposed on the surface of the substrate 1 opposite to the surface of the substrate 1 having the oriented layer 2 formed thereon, the retardation film 4 being a ¼ wavelength plate. Moreover, the retardation film 4 may be formed on the side of the polarizer 3. In this case, as illustrated in FIG. 3, a circularly polarizing plate 110 can have a form in which the substrate 1, the oriented layer 2, the polarizer 3, and the retardation film 4 are disposed in sequence.

When the circularly polarizing plate is manufactured, the substrate 1 or the polarizer 3 and the retardation film 4 may be bonded using an appropriate pressure-sensitive adhesive through a pressure-sensitive adhesive layer formed of a pressure-sensitive adhesive.

Figure 4:
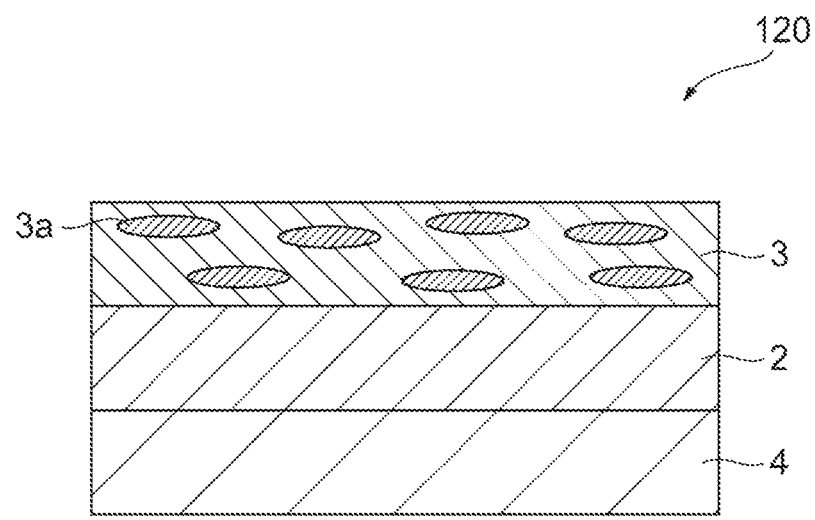
FIG. 4 is a sectional view schematically illustrating one embodiment of a circularly polarizing plate.

By using a substrate 1 (retardation film 4) having retardation properties preliminarily given as a transparent substrate, the transparent substrate itself may comprise a function as the retardation layer. If the transparent substrate itself is a retardation film, a circularly polarizing plate or an elliptically polarizing plate in the form of retardation film/photo-oriented layer/polarizer can be obtained. For example, in the case where a monoaxially stretched ¼ wavelength plate is used as a retardation film, the circularly polarizing plate can be manufactured by the roll-to-roll method by setting the irradiation direction of polarized UV so as to be about 45° to the traveling direction of the transparent substrate. Thus, as a ¼ wavelength plate used in manufacturing of the circularly polarizing plate, those having properties such that the in-plane retardation value to visible light is smaller as the wavelength is shorter are preferred. FIG. 4 is a sectional view schematically illustrating one embodiment of a circularly polarizing plate 120 in the case where the substrate itself functions as a retardation film. The circularly polarizing plate 120 can have a form comprising a retardation film 4 having an oriented layer 2 formed thereon, and a polarizer 3 disposed on the oriented layer 2.

Using ½ wavelength plate as a retardation film, a linearly polarizing plate roll set such that the angle formed by the slow axis of the ½ wavelength plate and the absorption axis of a polarizer is shifted is produced, and a ¼ wavelength plate is further formed on the surface opposite to the surface having the polarizer thereon; thereby; a broad-band circularly polarizing plate can be formed.

It is preferred that the birefringence to light having a wavelength of 450 nm, the birefringence to light having a wavelength of 550 nm, and the birefringence to light having a wavelength of 650 nm of the ¼ wavelength plate used as the retardation film have reverse wavelength dispersibility satisfying the relationships represented by the following expressions (II) and (III). In the expressions, $\Delta n(\lambda)$ represents the birefringence to light having a wavelength $\lambda$ nm.

$$\Delta n(450)/\Delta n(550) \leq 1.00 \quad (II)$$

$$1.00 \leq \Delta n(650)/\Delta n(550) \quad (III)$$

Such retardation films having reverse wavelength dispersing properties can be manufactured by the method described in JP 5463666 B.

4. Applications of Polarizing Plate

The polarizing plate can be used in a variety of display devices. The display device is a device having a display element, and comprises a light-emitting element or a light-emitting device as a light emitting source. Examples of the display device include liquid crystal display devices, organic electroluminescent (EL) display devices, inorganic electroluminescent (EL) display devices, electron emission display devices (such as field emission display devices (FEDs) and surface field emission display devices (SEDs)), electronic paper (display devices using electronic ink or electrophoretic elements), plasma display devices, projection display devices (such as grating light valve (GLV) display devices, display devices including digital micromirror devices (DMD)), and piezoelectric ceramic displays. Examples of the liquid crystal display devices include transmissive liquid crystal display devices, semi-transmissive liquid crystal display devices, reflective liquid crystal display devices, direct-view liquid crystal display devices, and projection liquid crystal display devices. These display devices may be display devices which display two-dimensional images, or may be stereoscopic display devices which display three-dimensional images. The polarizing plate according to the present embodiment can be effectively used in particularly display devices of organic EL display devices or inorganic EL display devices.

Examples of the electronic paper include those which display by optical anisotropy and molecules using orientation of dye molecules, those which display by particles such as electrophoresis, movement of particles, rotation of particles, and phase change, those which display by moving one end of a film, those which display by coloring of molecules/phase change, those which display by absorption of light by molecules, and those which display by binding of electrons and holes to perform self-emission of light. More specifically, examples thereof include those of microencapsulated electrophoresis types, horizontal electrophoresis types, vertical electrophoresis types, spherical twisted ball types, magnetic twisted ball types, cylindrical twisted ball types, charged toner types, electronic power fluid types, magnetic electrophoresis types, magnetic thermosensitive types, electrowetting types, light scattering types (change in transparency/cloudiness), cholesteric liquid crystal/photo-conductive layer types, cholesteric liquid crystal types, bistable nematic liquid crystal types, high dielectric liquid crystal types, dichromatic dye and liquid crystal dispersion types, movable films, color developing and quenching of leuco dyes, photochromic types, electrochromic types, electrodeposition types, and flexible organic ELs. The electronic paper may be not only personally used for texts and images but also used in advertising displays (signage). According to the polarizing plate according to the present embodiment, the thickness of the electronic paper can be reduced.

As a stereoscopic display device, for example, a method of alternately disposing different retardation films, such as a micropole method, is proposed (JP 2002-185983 A); however, by use of the polarizing plate according to the present embodiment, patterning is easier by printing, ink-jetting, or photolithography, and therefore the process of manufacturing a display device can be shortened, and the retardation film is unnecessary.

EXAMPLES

Hereinafter, the present invention will be described in more detail by way of Examples. "%" and "parts" in Examples are % by mass and parts by mass unless otherwise specified.

[Measurement of Absorbance]

The absorbance of the polarizer was measured as follows. Using an apparatus in which a holder with a polarizer was set in a spectrophotometer (made by SHIMADZU Corporation, UV-3150), the absorbance (A1) in the orientation direction of the dichroic dye (absorption axis direction) and the absorbance (A2) in a plane of the polarizer and in the direction vertical to the orientation (transmission axis direction) were measured by a double beam method in the wavelength range of 380 to 680 nm with a step of 2 nm. To remove the contribution of the light loss caused by surface reflection of the polarizing plate, a sample for measurement was set, zero point correction was performed at 800 nm having no light absorption, and the measurement was performed.

[Evaluation of Heat Resistance]

The surface of a triacetyl cellulose film of a polarizing plate was bonded to a glass substrate with a pressure-sensitive adhesive. The absorbance A1 in the absorption axis direction was then measured at 23° C. by the method (A1 (23° C.)). Subsequently, the sample was placed in an oven at 85° C. for 100 hours, was extracted, and again the measurement of the absorbance was performed by the method. The absorbance retention rate (%) was calculated by the following expression (I):

$$\text{absorbance retention rate (\%)} = A1\ (85°\ \text{C.}) / A1\ (23°\ \text{C.}) \times 100 \quad (I)$$

where A1 (85° C.) represents the absorbance in the absorption axis direction after the polarizing plate is kept in the heat-resistant oven at 85° C. for 100 hours, and A1 (23° C.) represents the absorbance in the absorption axis direction measured at 23° C. before the heat resistance test.

[Measurement of Film Thickness]

After the polarizing plate was cut with a microtome, its carbon deposited cross-section was observed with a scanning transmission electron microscope (STEM, field emission scanning electron microscope (FE-STEM), type: "S-5500", made by Hitachi, Ltd.) to measure the thickness of the polarizer (polarizing layer).

Example 1

[Preparation of Composition for Forming Photo-Oriented Layer]

A photo-orienting material (2 parts) represented by the following formula (3) and o-xylene (98 parts) as a solvent were mixed, and the resulting mixture was stirred at 80° C. for 1 hour to prepare a composition for forming a photo-oriented layer. The photo-orienting material represented by the following formula (3) was synthesized by the method described in JP 2013-33248 A.

[Chemical Formula 20]

(3)

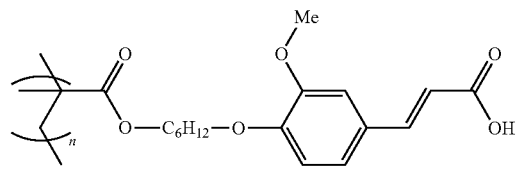

[Preparation of Composition for Forming Polarizer]

The following components were mixed, and were stirred at 80° C. for 1 hour to prepare a composition for forming a polarizer.

polymerizable liquid crystal compound;
compound represented by the following formula (4-6) 75 parts
compound represented by the following formula (4-7) 25 parts

[Chemical Formula 21]

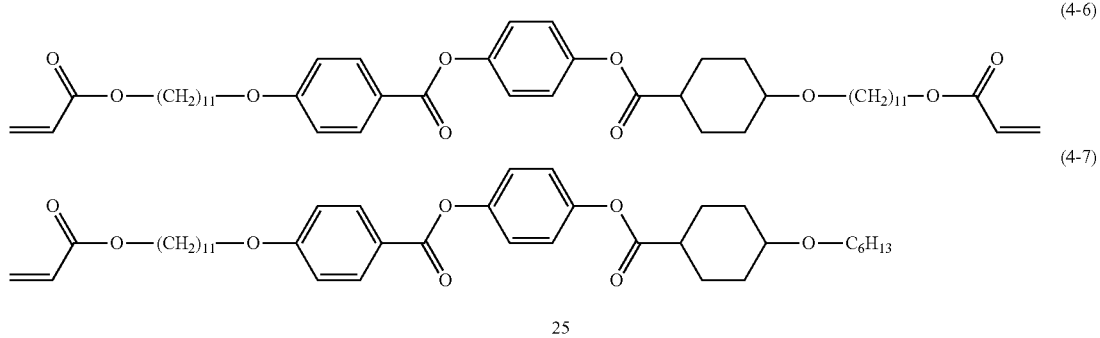

(4-6)

(4-7)

dichroic dye;
Magenta dye represented by the following formula (2-18) 1.3 parts
Yellow dye represented by the following formula (2-15) 1.3 parts
Cyan dye represented by the following formula (2-27) 1.3 parts

[Chemical Formula 22]

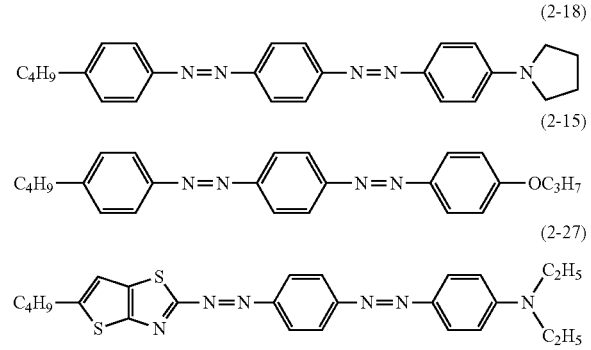

(2-18)

(2-15)

(2-27)

polymerization initiator; 2-dimethylamino-2-benzyl-1-(4-morpholinophenyl)butane-1-one (IRGACURE 369; made by BASF Japan Ltd.) 6 parts leveling agent;
polyacrylate compound (BYK-361N; made by BYK-Chemie GmbH) 1.2 parts
solvent; xylene 250 parts

[Manufacturing of Polarizing Film (Polarizing Plate)]

A roll of a triacetyl cellulose film (made by KONICA MINOLTA, INC., KC4 UY-TAC 40 μm) having a width of 600 mm was continuously fed at a rate of 8 m/min, and the film surface was subjected to a plasma treatment; then, the composition for forming a photo-oriented layer was ejected from a slot die coater at a flow rate of 16 mL/min, and was applied to a region of the film central portion having a width of 400 mm to form a first coating. Furthermore, the film was fed into an air-blow drying furnace set at 100° C. for 2 minutes to remove the solvent; thereby, a first dry film was formed. Subsequently, the first dry film was irradiated with UV light polarized in a 45° direction to the film traveling direction such that the intensity was 20 mJ/cm$^2$ (in terms of 313 nm); thereby, the orientation restraining force was given to manufacture a substrate film with a photo-oriented layer. The composition for forming a polarizer was ejected from the slot die coater onto the surface of the photo-oriented layer at a flow rate of 30 mL/min, and was applied to a region of the film central portion having a width of 400 mm to form a second coating. Furthermore, the film was fed into an air-blow drying furnace set at 110° C. for 2 minutes to remove the solvent; thereby, a second dry film was formed. Subsequently, the film was irradiated with UV light at 500 mJ/cm$^2$ (in terms of 365 nm) to polymerize and cure the polymerizable liquid crystal compound; thereby, a polarizer was formed. Subsequently, the polarizer was continuously wound into a roll to manufacture a polarizing film roll having an absorption axis in a 45° direction. A piece from this long polarizing film roll thus manufactured into a 3 cm square was used as a polarizing plate, and a variety of evaluations was performed. The film thickness of the polarizer, the absorbances of the dichroic dyes at their maximum absorption wavelengths, and their absorbance retention rates are shown in Table 1.

Example 2

A polarizing film roll was manufactured in the same manner as in Example 1 except that the coating flow rate of the composition for forming a polarizer was 15 mL/min, and the same measurement as in Example 1 was performed.

Example 3

A polarizing film roll was manufactured in the same manner as in Example 1 except that the amounts of the dichroic dyes to be mixed were varied as follows, and the same measurement as in Example 1 was performed.

| | |
|---|---|
| Magenta dye represented by the formula (2-18) | 2.3 parts |
| Yellow dye represented by the formula (2-15) | 2.3 parts |
| Cyan dye represented by the formula (2-27) | 2.3 parts |

Example 4

A polarizing film roll was manufactured in the same manner as in Example 2 except that the amounts of the dichroic dyes to be mixed were varied as follows, and the same measurement as in Example 2 was performed.

| Magenta dye represented by the formula (2-18) | 2.3 parts |
| Yellow dye represented by the formula (2-15) | 2.3 parts |
| Cyan dye represented by the formula (2-27) | 2.3 parts |

Comparative Example 1

[Manufacturing of Iodine PVA Polarizing Plate]

A polyvinyl alcohol) film having a thickness of 75 μm at an average degree of polymerization of about 2400 and a degree of saponification of 99.9 mol % or more was monoaxially stretched about 5.5 times by a dry method; furthermore, while the tensed state was kept, the film was immersed in pure water at 60° C. for 60 seconds, and then was immersed in an aqueous solution of iodine/potassium iodide/water having a weight ratio of 0.05/5/100 at 23° C. for 30 seconds. Subsequently, the film was immersed in an aqueous solution of potassium iodide/boric acid/water having a weight ratio of 8.5/8.5/100 at 72° C. for 300 seconds. Subsequently, the film was washed with pure water at 23° C. for 15 seconds, and was dried at 70° C. for 2 minutes to obtain a polarizer in which iodine was adsorbed on and oriented in the poly(vinyl alcohol) resin. The polarizer was measured with a contact film thickness meter; the thickness was 25 μm. Both surfaces of the thus-obtained polarizer were protected with a saponified triacetyl cellulose film (made by KONICA MINOLTA, INC., KC4UY-TAC 40 μm) through a poly(vinyl alcohol) adhesive prepared from 3 parts of carboxyl group-modified poly(vinyl alcohol) [made by Kuraray Co., Ltd., Kuraray POVAL KL318] and 1.5 parts of a water-soluble polyamide epoxy resin [made by Sumika Chemtex Company, Limited, Sumirez resin (registered trademark) 650 (aqueous solution having a solid content of 30%)] to manufacture a polarizing plate. This polarizing plate was sampled, and the same measurement as in Example 1 was performed; light absorption attributed to an I3-PVA complex at a maximum absorption wavelength of 474 nm and light absorption attributed to an I5-PVA complex at a maximum absorption wavelength of 594 nm were measured.

Comparative Example 2

A polarizing film was manufactured in the same manner as in Comparative Example 1 except that the film was immersed in an aqueous solution of iodine/potassium iodide/water having a weight ratio of 0.06/6/100 at 23° C. for 30 seconds. This polarizing film was sampled, and the same measurement as in Example 1 was performed; light absorption attributed to an I3-PVA complex at a maximum absorption wavelength of 474 nm and light absorption attributed to an I5-PVA complex at a maximum absorption wavelength of 594 nm were measured.

Comparative Example 3

A polarizing film was manufactured in the same manner as in Comparative Example 1 except that the film was immersed in an aqueous solution of iodine/potassium iodide/water having a weight ratio of 0.06/6/100 at 23° C. for 40 seconds. This polarizing film was sampled, and the same measurement as in Example 1 was performed; light absorption attributed to an I3-PVA complex at a maximum absorption wavelength of 474 nm and light absorption attributed to an I5-PVA complex at a maximum absorption wavelength of 594 nm were measured.

TABLE 1

| | Thickness of polarizer | Dichroic dye | Initial | | | After 100 hours | | Absorbance retention rate |
|---|---|---|---|---|---|---|---|---|
| | | | λ MAX | A1 | A2 | A1 | A2 | |
| Example 1 | 2.0 μm | Yellow | 410 | 0.83 | 0.03 | 0.81 | 0.04 | 97% |
| | | Magenta | 520 | 0.77 | 0.02 | 0.75 | 0.02 | 98% |
| | | Cyan | 620 | 0.81 | 0.02 | 0.78 | 0.02 | 96% |
| Example 2 | 1.0 μm | Yellow | 410 | 0.42 | 0.03 | 0.40 | 0.03 | 97% |
| | | Magenta | 520 | 0.38 | 0.01 | 0.38 | 0.01 | 98% |
| | | Cyan | 620 | 0.41 | 0.01 | 0.39 | 0.01 | 96% |
| Example 3 | 2.0 μm | Yellow | 410 | 1.47 | 0.04 | 1.44 | 0.03 | 98% |
| | | Magenta | 520 | 1.36 | 0.03 | 1.32 | 0.01 | 97% |
| | | Cyan | 620 | 1.43 | 0.03 | 1.39 | 0.01 | 97% |
| Example 4 | 1.0 μm | Yellow | 410 | 0.74 | 0.03 | 0.72 | 0.03 | 97% |
| | | Magenta | 520 | 0.69 | 0.02 | 0.66 | 0.01 | 96% |
| | | Cyan | 620 | 0.73 | 0.02 | 0.71 | 0.01 | 97% |
| Comparative Example 1 | 25 μm | I3-PVA | 474 | 1.41 | 0.02 | 1.24 | 0.02 | 88% |
| | | I5-PVA | 594 | 1.53 | 0.01 | 1.08 | 0.01 | 70% |
| Comparative Example 2 | 25 μm | I3-PVA | 474 | 1.58 | 0.02 | 1.51 | 0.01 | 95% |
| | | I5-PVA | 594 | 1.73 | 0.01 | 1.25 | 0.02 | 73% |
| Comparative Example 3 | 25 μm | I3-PVA | 474 | 1.75 | 0.02 | 1.70 | 0.02 | 97% |
| | | I5-PVA | 594 | 1.81 | 0.01 | 1.40 | 0.01 | 77% |

The polarizing plates in Examples 1 to 4 were thin films, but had high light absorbing selectivity, and had very high heat resistance in regions having very low absorbance. Moreover, in the polarizing plates in Examples 1 to 4, no warpage occurred after the heat-resistant test, and favorable film shapes were kept.

In the polarizing plates in Comparative Examples 1 to 3, the absorbance attributed to the light absorption by the I5-PVA complex reduced to about 70 to 77% after the heat-resistant test, and the light absorption at a long wavelength was weaker than that at a short wavelength; for this reason, the whole polarizing plates had reddish color phases. Moreover, the polarizing plates in Comparative Examples 1 to 3 had significant deformation due to heat of PVA, and significant warpage occurred.

INDUSTRIAL APPLICABILITY

Since the polarizing plate according to the present invention has high light absorbing selectivity in the form of a thin film and has high heat resistance, the polarizing plate according to the present invention is extremely useful in manufacturing of liquid crystal display devices, (organic) EL display devices, and projection liquid crystal display devices.

REFERENCE SIGNS LIST

1 . . . substrate, 2 . . . oriented layer, 3 . . . polarizer, 3a . . . dichroic dye, 4 . . . retardation film, 10 . . . polarizing plate, 100, 110, 120 . . . circularly polarizing plate.

The invention claimed is:

1. A polarizing plate comprising a substrate and a polarizer, wherein the polarizer has a polarizing layer having a thickness of 5 mm or less in which a dichroic dye is oriented, an absorbance in the absorption axis direction (A1) of the polarizer at a wavelength of 380 to 760 nm is 0.3 or more and 1 or less, and an absorbance in a transmission axis direction (A2) is 0.001 or more and 0.10 or less, and wherein the dichroic dye consists of two dichroic azo dyes having an absorption maximum at a wavelength in the range of 380 to 550 nm and one dichroic azo dye having an absorption maximum at a wavelength in the range 550 to 700 nm, and wherein the polarizing layer comprises a polymer of a polymerizable liquid crystal compound exhibiting a smectic liquid crystal phase.

2. The polarizing plate according to claim 1, wherein the dichroic dye is an organic dye.

3. The polarizing plate according to claim 1, wherein the polymerizable liquid crystal compound is a compound exhibiting a higher smectic liquid crystal phase.

4. The polarizing plate according to claim 1, wherein the polarizer exhibits a Bragg peak in X-ray diffraction measurement.

5. A circularly polarizing plate comprising the polarizing plate according to claim 1, and a ¼ wavelength plate.

6. The circularly polarizing plate according to claim 5, wherein a birefringence of the ¼ wavelength plate to light having a wavelength of 450 nm, a birefringence to light having a wavelength of 550 nm, and a birefringence to light having a wavelength of 650 nm have reverse wavelength dispersibility satisfying relationships represented by the following expressions (II) and (III):

$$\Delta n(450)/\Delta n(550) \leq 1.00 \quad (II)$$

$$1.00 \leq \Delta n(650)/\Delta n(550) \quad (III)$$

wherein $\Delta n(450)$, $\Delta n(550)$ and $\Delta n(650)$ represent a birefringence to light at a wavelength $\lambda$ of 450 nm, 550 nm and 650 nm, respectively.

* * * * *